(12) United States Patent
Matsunaga et al.

(10) Patent No.: US 10,219,349 B2
(45) Date of Patent: Feb. 26, 2019

(54) ORGANIC ELECTROLUMINESCENCE DEVICE INCLUDING A MICRO-CAVITY LIGHT EXTRACTION STRUCTURE

(71) Applicant: Sharp Kabushiki Kaisha, Sakai, Osaka (JP)

(72) Inventors: Kazuki Matsunaga, Sakai (JP); Katsuhiro Kikuchi, Sakai (JP); Hideki Uchida, Sakai (JP); Satoshi Inoue, Sakai (JP); Masanori Ohara, Sakai (JP); Eiji Koike, Sakai (JP); Yuto Tsukamoto, Sakai (JP); Yoshiyuki Isomura, Sakai (JP)

(73) Assignee: SHARP KABUSHIKI KAISHA, Sakai (JP)

( * ) Notice: Subject to any disclaimer, the term of this patent is extended or adjusted under 35 U.S.C. 154(b) by 58 days.

(21) Appl. No.: 15/506,976

(22) PCT Filed: Aug. 24, 2015

(86) PCT No.: PCT/JP2015/073689
§ 371 (c)(1),
(2) Date: Feb. 27, 2017

(87) PCT Pub. No.: WO2016/031757
PCT Pub. Date: Mar. 3, 2016

(65) Prior Publication Data
US 2017/0280530 A1    Sep. 28, 2017

(30) Foreign Application Priority Data

Aug. 29, 2014   (JP) ................................ 2014-175625

(51) Int. Cl.
*H01L 23/58*    (2006.01)
*H05B 33/08*    (2006.01)
(Continued)

(52) U.S. Cl.
CPC ..... *H05B 33/0896* (2013.01); *H01L 51/5265* (2013.01); *H01L 51/5271* (2013.01);
(Continued)

(58) Field of Classification Search
CPC .... H05B 33/0896; H05B 33/28; H05B 33/10; H05B 33/24; H01L 51/5271; H01L 51/5265; H01L 2251/5315
USPC ....................................................... 257/642
See application file for complete search history.

(56) References Cited

U.S. PATENT DOCUMENTS 7,166,959 B2 *  1/2007  Suzuki ............... H01L 51/5265
                                                313/504
7,586,575 B2 *  9/2009  Higa .................. G02F 1/133555
                                                349/144
(Continued)

FOREIGN PATENT DOCUMENTS

JP   2003-229283 A       8/2003
JP   2003229283 A   *   8/2003
(Continued)

OTHER PUBLICATIONS

Official Communication issued in International Patent Application No. PCT/JP2015/073689, dated Nov. 24, 2015.

*Primary Examiner* — Mohammad M Hoque
(74) *Attorney, Agent, or Firm* — Keating & Bennett, LLP

(57) ABSTRACT

An organic electroluminescence device according to one aspect of the present invention includes: a base material in which a recess is provided at an upper surface of the base material; a reflective layer that is provided at least along a surface of the recess; a filling layer that is filled into an inside of the recess via the reflective layer, the filling layer having light transmissivity; a first electrode that is provided at least on a layer above the filling layer, the first electrode having light transmissivity and light reflectivity; an organic layer
(Continued)

that is provided on a layer above the first electrode, the organic layer including at least a light-emitting layer; and a second electrode that is provided on a layer above the organic layer, the second electrode having light transmissivity and light reflectivity. A part of the reflective layer contacts a part of the first electrode.

16 Claims, 13 Drawing Sheets

(51) Int. Cl.
  *H05B 33/10* (2006.01)
  *H05B 33/24* (2006.01)
  *H05B 33/28* (2006.01)
  *H01L 51/52* (2006.01)
(52) U.S. Cl.
  CPC ............. *H05B 33/10* (2013.01); *H05B 33/24* (2013.01); *H05B 33/28* (2013.01); *H01L 2251/5315* (2013.01)

(56) References Cited

U.S. PATENT DOCUMENTS

| | | | |
|---|---|---|---|
| 2010/0090592 A1 | 4/2010 | Shiobara et al. | |
| 2010/0164842 A1 | 7/2010 | Ishihara et al. | |
| 2012/0261684 A1* | 10/2012 | Koshihara | H01L 51/5265 257/89 |
| 2014/0312319 A1* | 10/2014 | Kim | H01L 27/3258 257/40 |
| 2015/0060832 A1* | 3/2015 | Ito | H01L 51/5225 257/40 |
| 2015/0270512 A1* | 9/2015 | Yamae | H01L 51/5268 257/40 |

FOREIGN PATENT DOCUMENTS

| | | |
|---|---|---|
| JP | 2010-114428 A | 5/2010 |
| JP | 2010-153284 A | 7/2010 |
| JP | 2011-108531 A | 6/2011 |

\* cited by examiner

ORGANIC ELECTROLUMINESCENCE DEVICE INCLUDING A MICRO-CAVITY LIGHT EXTRACTION STRUCTURE

TECHNICAL FIELD

The present invention relates to an organic electroluminescence device, a production method for an organic electroluminescence device, an illumination device, and a display device.

The subject application claims priority based on the patent application No. 2014-175625 filed in Japan on Aug. 29, 2014 and incorporates by reference herein the content thereof.

BACKGROUND ART

One known form of display device is a self-light-emitting type display device such as an organic electroluminescence display device. Electroluminescence will be abbreviated EL herein. In an organic EL display device, light emitted from a light-emitting layer progresses in all directions, and a part of the light is totally reflected by the difference in refractive indexes between the light-emitting element and an external space (air). A large amount of the light totally reflected at the boundary between the light-emitting element and air is bound within the light-emitting element, and is not extracted to the external space. For example, if the refractive index of the external space is 1.8, of the light emitted from the light-emitting layer, approximately 20% is extracted to the external space, and the remaining approximately 80% is bounded within the light-emitting layer. In this manner, a conventional organic EL device has the problem of a low light usage efficiency.

In Patent Document 1 noted below, an organic EL display device that has a carrier substrate, an organic EL element provided on the carrier substrate, and a light-reflecting layer that reflects light emitted from the organic EL element is disclosed. In the organic EL display device, a recess that includes an inclined surface along the outer edge of an organic light-emitting layer is provided in the light-reflecting layer. Light emitted from the light-emitting layer, after being reflected at the inclined surface of the recess, returns toward the organic EL element once again. This constitution is described as preventing image quality deterioration by, for example, bleeding, and improvement in light usage efficiency.

In general, the light emission spectrum of a light-emitting material tends to be a broad distribution over a wide wavelength range. For that reason, if high color purity is demanded, it is not possible to obtain the desired color purity with the intrinsic spectrum of a light-emitting material. A method that has been proposed for increasing the color purity is a so-called microcavity structure, in which light emitted from a light-emitting layer is caused to multiply reflect and resonate between a pair of reflective layers. When light is multiply reflected and resonates between a pair of reflective layers, the effect is achieved of the light emission spectrum in the vicinity of the resonant wavelength becoming steep, the light intensity at the peak wavelength increasing and the color purity increasing. For example, Patent Document 2 noted below discloses an organic light-emitting display device having a lower electric, an upper electrode, and an alternately stacked dielectric film, with a microcavity structure formed by the alternately stacked dielectric film and the lower electrode.

PRIOR ART DOCUMENTS

Patent Documents

[Patent Document 1] Japanese Patent Application Publication No. 2003-229283
[Patent Document 2] Japanese Patent Application Publication No. 2010-153284

SUMMARY OF THE INVENTION

Problem to be Solved by the Invention

However, although the constitution of Patent Document 1 improves the light usage efficiency, the emitted light extracted at a prescribed angle is synthesized light having various light paths. Therefore, it is difficult to increase the color purity by the microcavity effect. With the constitution of Patent Document 2, because the effect occurs only at a specific angle, for example light emitted in the straight frontal direction, the color purity exhibits viewing angle dependency, and it is difficult to improve the efficiency of extracting all the light. In this manner, although improvement of the light usage efficiency and improvement of the color purity are individually achieved, it is difficult to improve both simultaneously. Although the case of an organic EL display device is presented here as an example, this problem is not restricted to application as a display device, and is common as well to application as an illumination device.

One aspect of the present invention has been made to solve the above-noted problems, and has an object to provide an organic electroluminescence device, a production method for an organic electroluminescence device, an illumination device, and a display device having both superior light usage efficiency and superior color purity.

Means for Solving the Problems

An organic electroluminescence device according to one aspect of the present invention includes: a base material in which a recess is provided at an upper surface of the base material; a reflective layer that is provided at least along a surface of the recess; a filling layer that is filled into an inside of the recess via the reflective layer, the filling layer having light transmissivity; a first electrode that is provided at least on a layer above the filling layer, the first electrode having light transmissivity and light reflectivity; an organic layer that is provided on a layer above the first electrode, the organic layer including at least a light-emitting layer; and a second electrode that is provided on a layer above the organic layer, the second electrode having light transmissivity and light reflectivity, wherein a part of the reflective layer contacts a part of the first electrode.

An organic electroluminescence device according to one aspect of the present invention includes: a base material in which a recess is provided at an upper surface of the base material; a reflective layer that is provided at least along a surface of the recess; a filling layer that is filled into an inside of the recess via the reflective layer, the filling layer having light transmissivity; a first electrode that is provided at least on a layer above the filling layer, the first electrode having light transmissivity; an organic layer that is provided on a layer above the first electrode, the organic layer including at least a light-emitting layer; a second electrode that is provided on a layer above the organic layer, the second electrode having light transmissivity and light reflectivity; and a semi-transmissive/reflective film that is provided between the first electrode and the reflective layer, the semi-transmissive/reflective film having light transmissivity and light reflectivity, wherein a part of the reflective layer contacts a part of the first electrode.

In the organic electroluminescence device according to one aspect of the present invention, a configuration may be adopted such that the filling layer includes a first filling layer and second filling layer, and the semi-transmissive/reflective film is provided between the first filling layer and the second filling layer.

In the organic electroluminescence device according to one aspect of the present invention, a configuration may be adopted such that a lower surface of the first electrode at a position in the recess is positioned below a plane that includes the upper surface.

In the organic electroluminescence device according to one aspect of the present invention, a configuration may be adopted such that the lower surface of the light-emitting layer at a position in the recess is positioned lower than a plane that includes the upper surface.

In the organic electroluminescence device according to one aspect of the present invention, the second electrode may be constituted by a metal film.

In the organic electroluminescence device according to one aspect of the present invention, a configuration may be adopted such that a cross-section shape of the recess cut by an arbitrary plane that is perpendicular to the upper surface is an arc.

A method for manufacturing an organic electroluminescence device according to one aspect of the present invention includes: a step of forming a recess at an upper surface of a base material; a step of forming a reflective layer at least along a surface of the recess; a step of forming a filling layer inside the recess via the reflective layer, the filling layer having light transmissivity; a step of forming a first electrode at least on a layer above the filling layer, the first electrode having light transmissivity and light reflectivity; a step of forming an organic layer on a layer above the first electrode, the organic layer including at least a light-emitting layer; and a step of forming a second electrode on a layer above the organic layer, the second electrode having light transmissivity and light reflectivity, wherein, in the step of forming the first electrode, the first electrode is formed so that a part of the first electrode contacts a part of the reflective layer.

A method for manufacturing an organic electroluminescence device according to one aspect of the present invention includes: a step of forming a recess at an upper surface of a base material; a step of forming a reflective layer at least along the surface of the recess; a step of forming a filling layer inside the recess via the reflective layer, the filling layer having light transmissivity; a step of forming a first electrode at least on a layer above the filling layer, the first electrode having light transmissivity; a step of forming an organic layer on a layer above the first electrode, the organic layer including at least a light-emitting layer; a step of forming a second electrode on a layer above the organic layer, the second electrode having light transmissivity and light reflectivity; and a step of forming a semi-transmissive/reflective film between the first electrode and the reflective layer, the semi-transmissive/reflective film having light transmissivity and light reflectivity, wherein, in the step of forming the first electrode, the first electrode is formed so that a part of the first electrode contacts a part of the reflective layer.

An illumination device according to one aspect of the present invention includes: a base material in which a recess is provided at an upper surface of the base material; a reflective layer that is provided at least along a surface of the recess; a filling layer that is filled into an inside of the recess via the reflective layer, the filling layer having light transmissivity; a first electrode that is provided at least on a layer above the filling layer, the first electrode having light transmissivity and light reflectivity; an organic layer that is provided on a layer above the first electrode, the organic layer including at least a light-emitting layer; and a second electrode that is provided on a layer above the organic layer, the second electrode having light transmissivity and light reflectivity, wherein a part of the reflective layer contact a part of the first electrode.

An illumination device according to one aspect of the present invention includes: a base material in which a recess is provided at an upper surface of the base material; a reflective layer that is provided at least along a surface of the recess; a filling layer that is filled into an inside of the recess via the reflective layer, the filling layer having light transmissivity; a first electrode that is provided at least on a layer above the filling layer, the first electrode having light transmissivity; an organic layer that is provided on a layer above the first electrode, the organic layer including at least a light-emitting layer; a second electrode that is provided on a layer above the organic layer, the second electrode having light transmissivity and light reflectivity; and a semi-transmissive/reflective film that is provided between the first electrode and the reflective layer, the semi-transmissive/reflective film having light transmissivity and light reflectivity, wherein a part of the reflective layer contacts a part of the first electrode.

A display device according to one aspect of the present invention includes: a base material in which a recess is provided at an upper surface of the base material; a reflective layer that is provided at least along a surface of the recess; a filling layer that is filled into an inside of the recess via the reflective layer, the filling layer having light transmissivity; a first electrode that is provided at least on a layer above the filling layer, the first electrode having light transmissivity and light reflectivity; an organic layer that is provided on a layer above the first electrode, the organic layer including at least a light-emitting layer; and a second electrode that is provided on a layer above the organic layer, the second electrode having light transmissivity and light reflectivity, wherein a part of the reflective layer contacts a part of the first electrode.

A display device according to one aspect of the present invention includes: a base material in which a recess is provided at an upper surface of the base material; a reflective layer that is provided at least along a surface of the recess; a filling layer that is filled into an inside of the recess via the reflective layer, the filling layer having light transmissivity; a first electrode that is provided at least on a layer above the filling layer, the first electrode having light transmissivity; an organic layer that is provided on a layer above the first electrode, the organic layer including at least a light-emitting layer; a second electrode that is provided on a layer above the organic layer, the second electrode having light transmissivity and light reflectivity; and a semi-transmissive/reflective film that is provided between the first electrode and the reflective layer, the semi-transmissive/reflective film having light transmissivity and light reflectivity, wherein a part of the reflective layer contacts a part of the first electrode.

Effect of the Invention

According to one aspect of the present invention, it is possible to provide an organic electroluminescence device having superior light usage efficiency.

BRIEF DESCRIPTIONS OF THE DRAWINGS

FIG. 4(A) to 4(D) shows cross-sectional views of the detailed constitution of each unit light-emitting region of each color.

FIG. 5(A) to 5(C) are cross-sectional views of a manufacturing process for an organic EL device.

Figure 5:
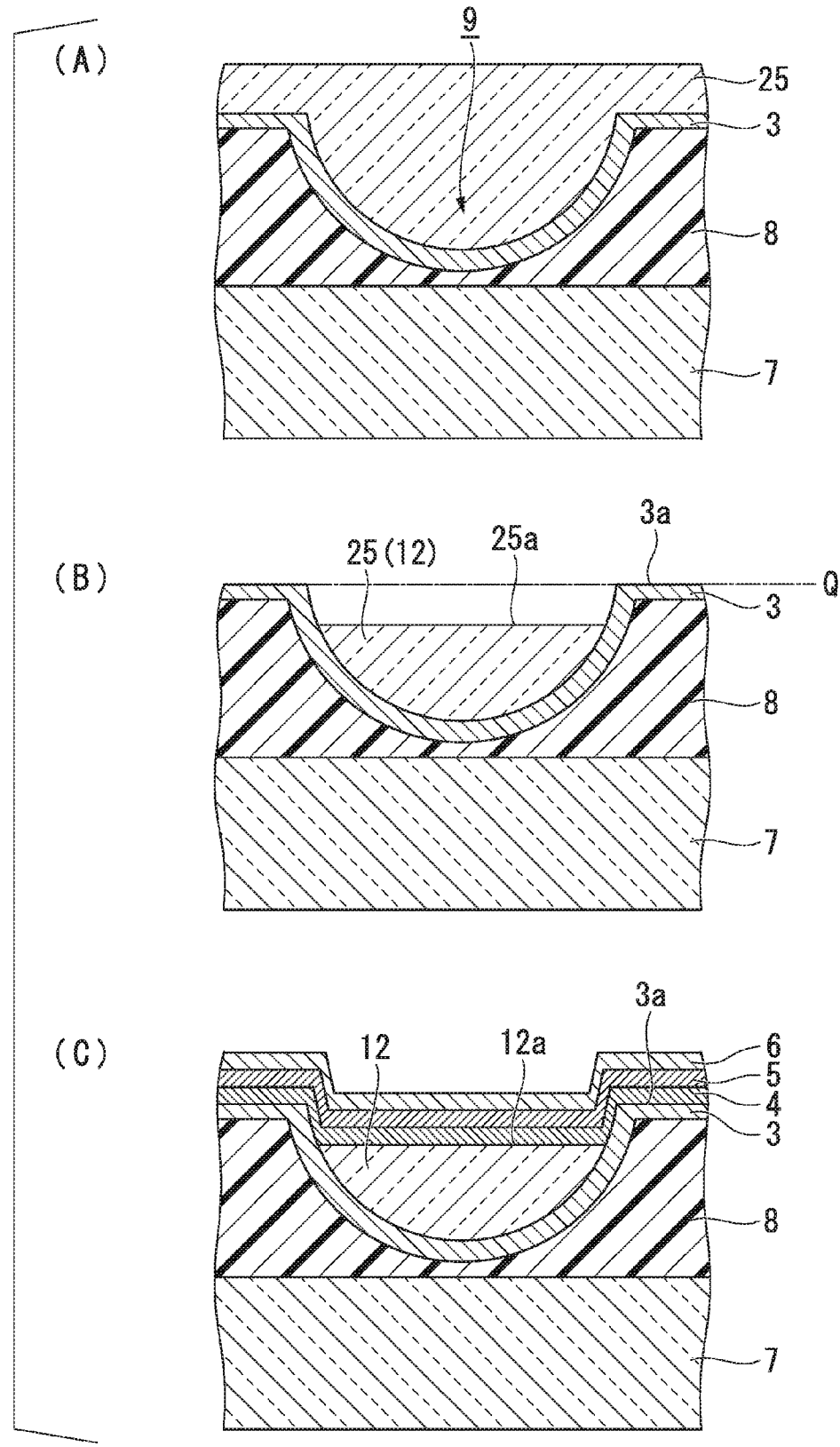
Figure 6:
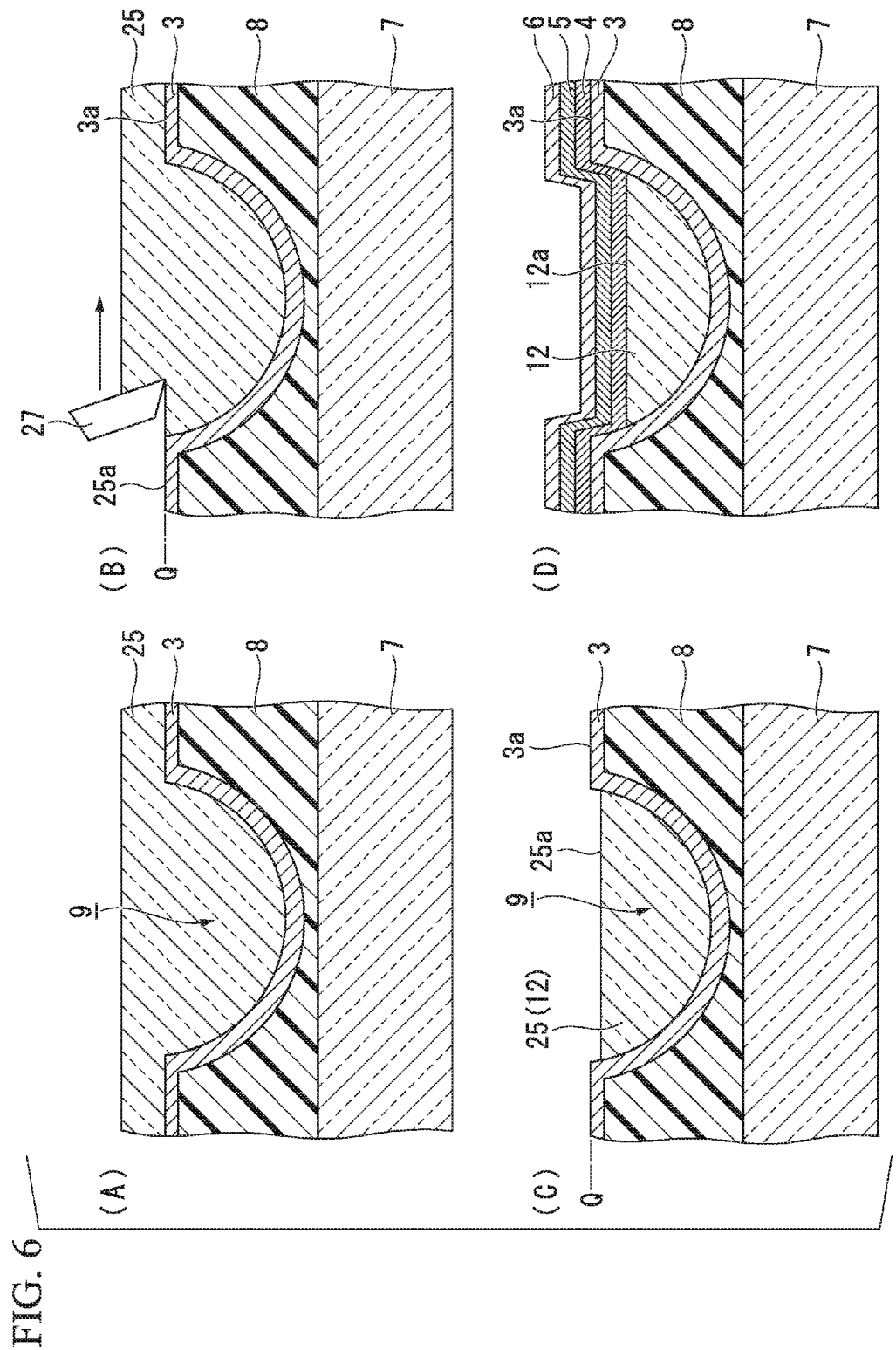

FIG. 6(A) to 6(D) are cross-sectional views showing a first example of a manufacturing process following the manufacturing process shown in FIG. 5.

Figure 7:
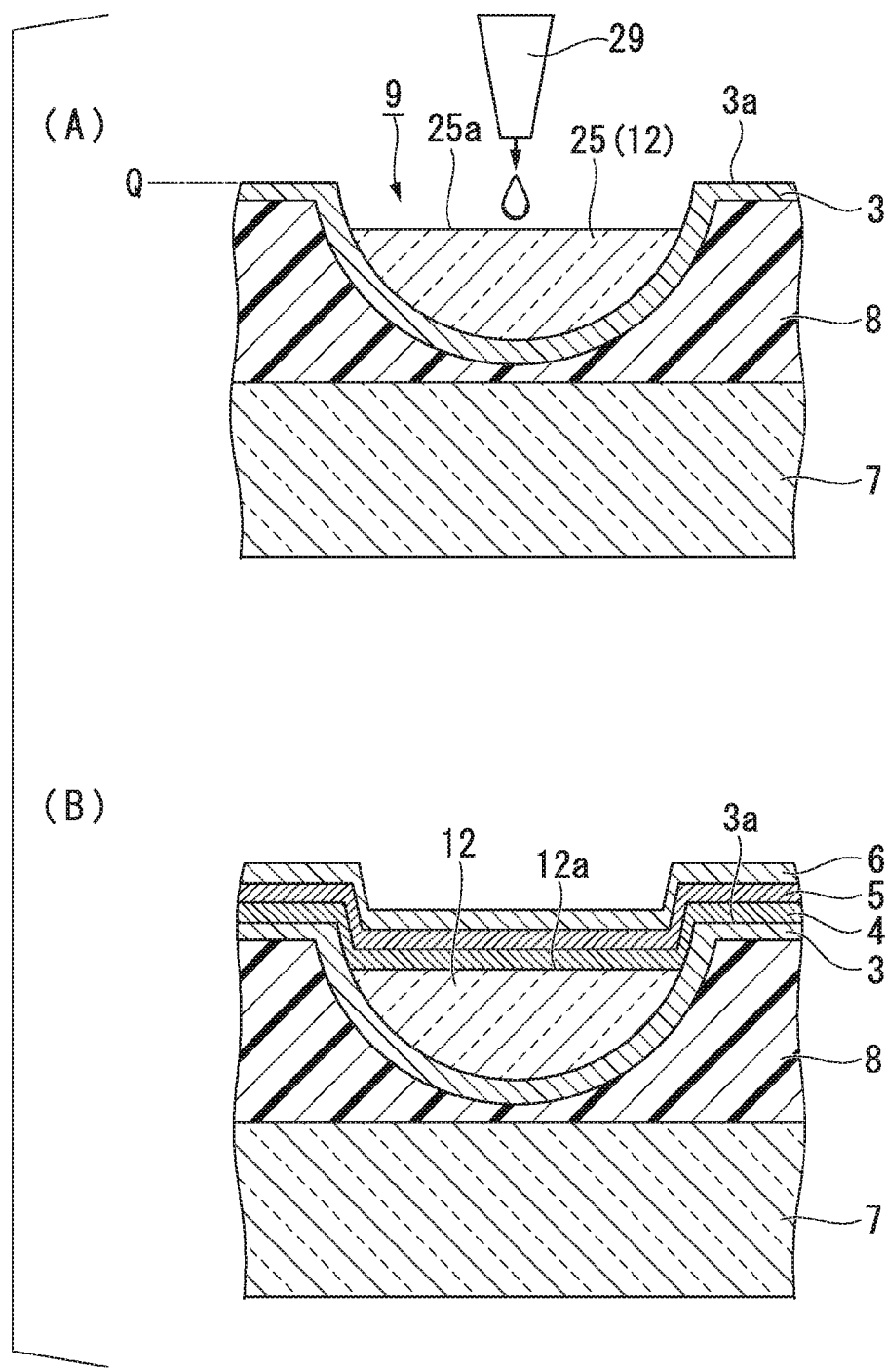

FIGS. 7(A) and 7(B) are cross-sectional views showing a second example of a manufacturing process following the manufacturing process shown in FIG. 5.

Figure 8:
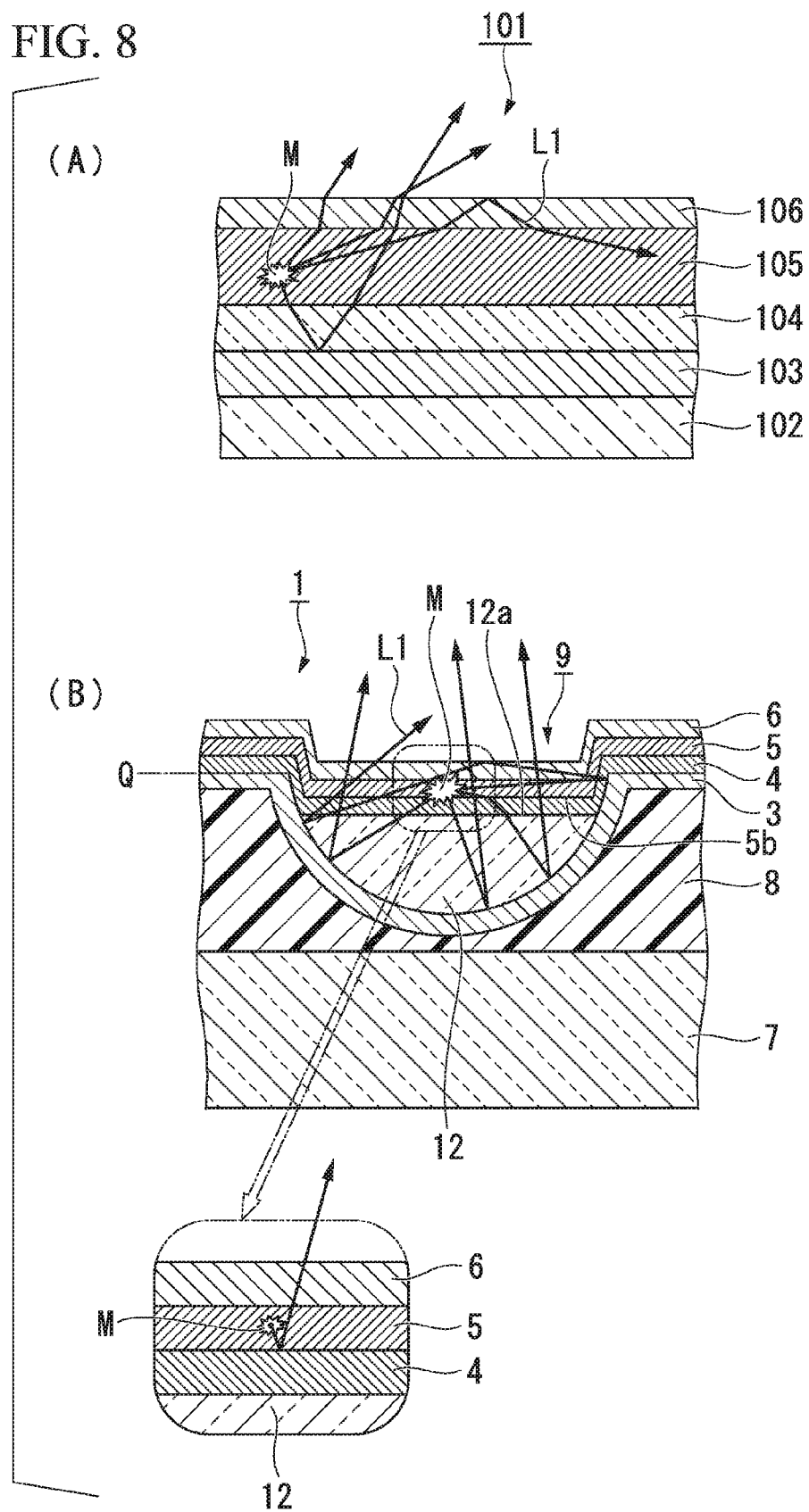

FIG. 8(A) is a cross-sectional view showing a conventional organic EL device, and 8(B) is a cross-sectional view showing an organic EL device of the present embodiment.

Figure 9:
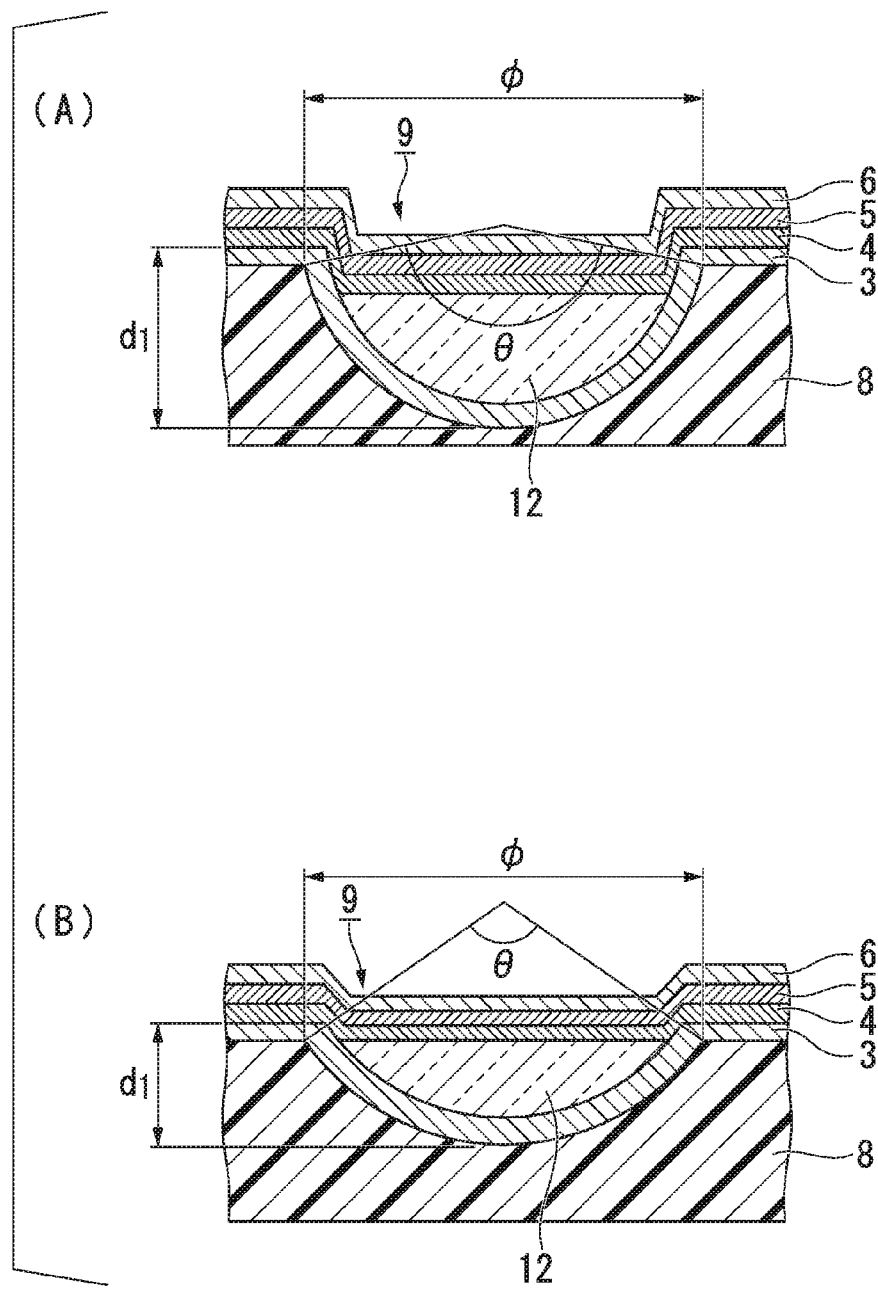

FIGS. 9(A) and 9(B) are drawings describing parameters indicating the depth of a recess.

Figure 10:
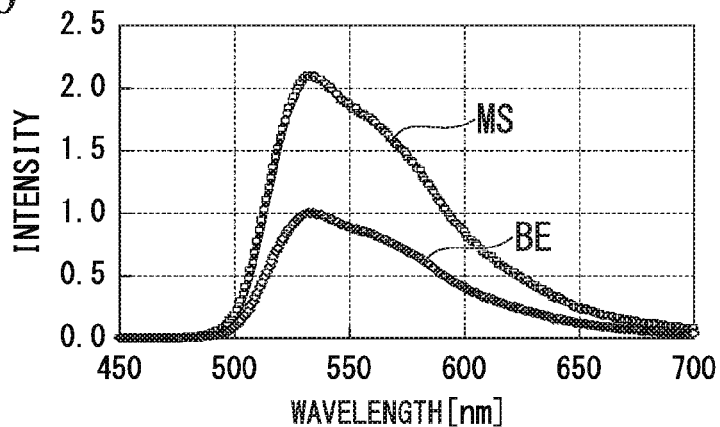

FIG. 10 is a graph showing the frontal irradiation intensity of a bottom-emission structure organic EL device and a light extraction structure organic EL device.

Figure 11:
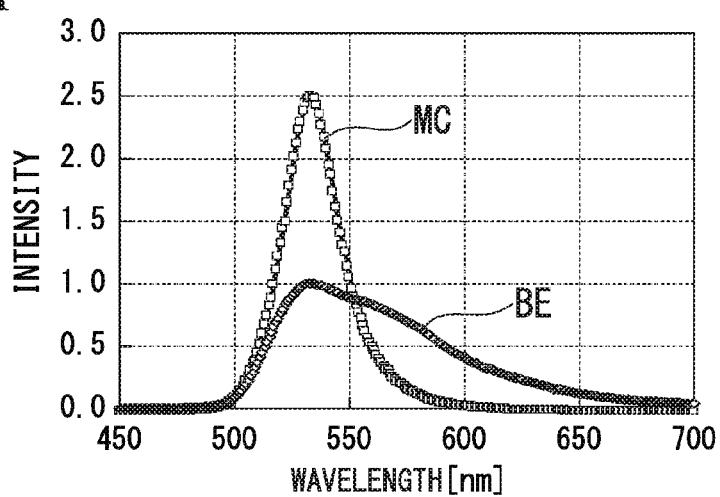

FIG. 11 is a graph showing the frontal irradiation intensity of a bottom-emission structure organic EL device and a microcavity structure organic EL device.

Figure 12:
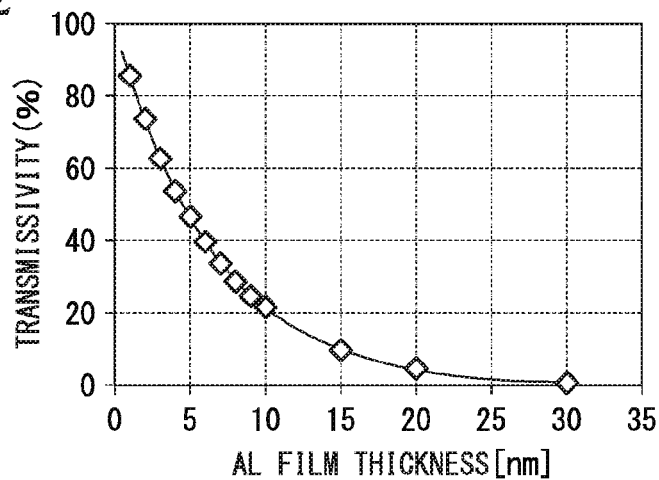

FIG. 12 shows the relationship between the film thickness and the light transmissivity of the first electrode.

Figure 13:
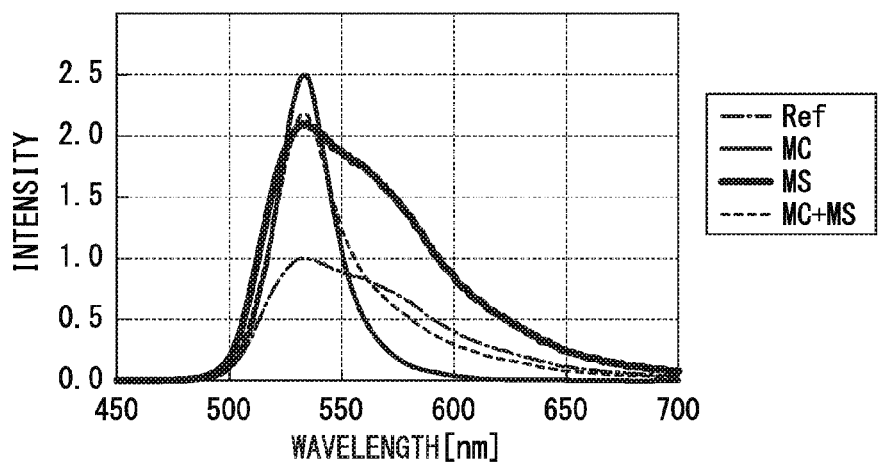

FIG. 13 shows the light emission spectra of the organic EL device of the first embodiment, and organic EL devices of a bottom-emission structure, a microcavity (MC) structure, and a light extraction (MS) structure.

Figure 14:
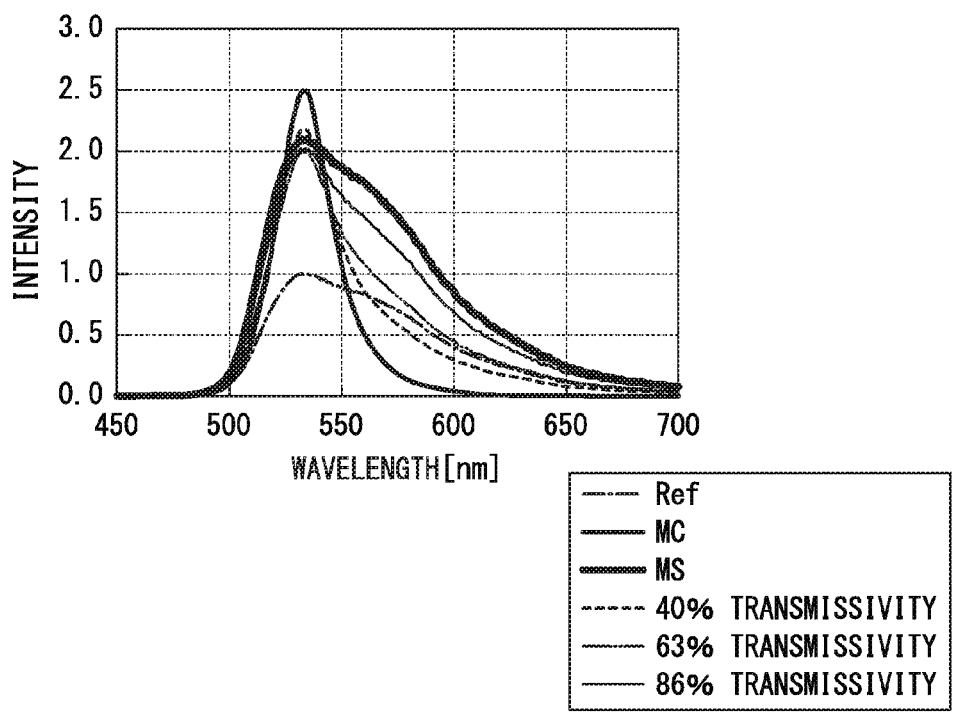

FIG. 14 shows the light emission spectra of organic EL devices of a bottom-emission structure with light transmissivities of 40%, 63%, and 86%, a microcavity (MC) structure, and a light-extraction (MS) structure.

Figure 15:
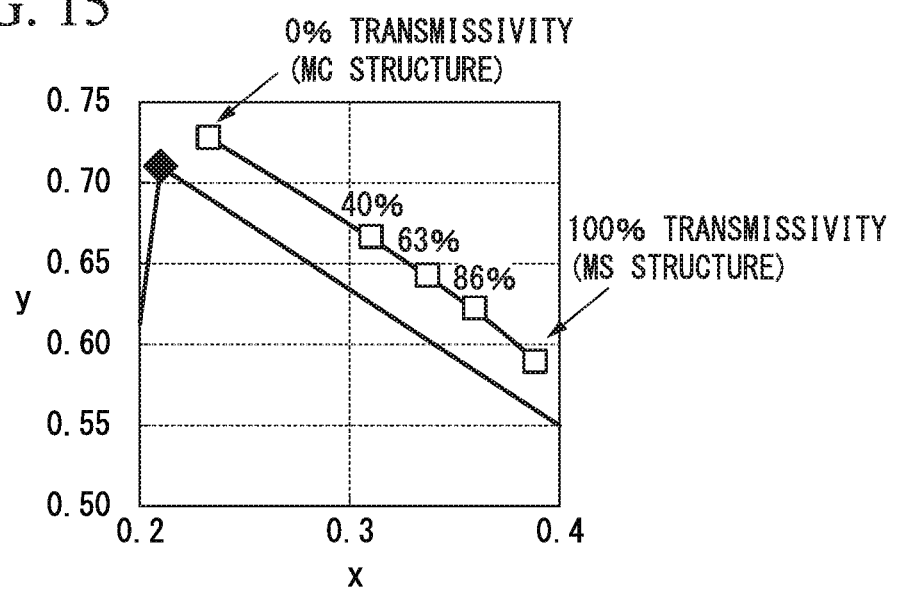

FIG. 15 shows the relationship between the light transmissivity (%) that changes in response to the film thickness of the first electrode and the xy chromaticity chart.

Figure 16:
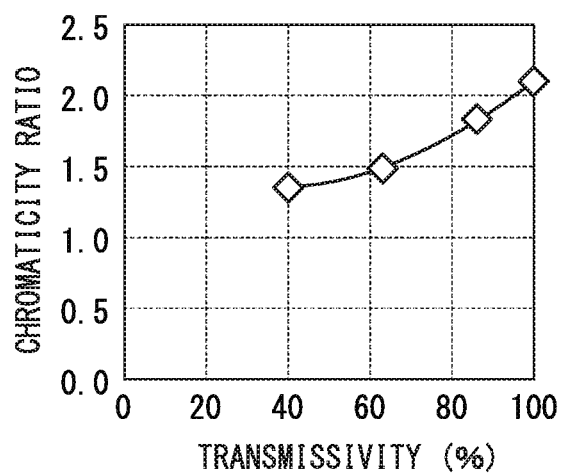

FIG. 16 shows the relationship between the first electrode film thickness and the luminance of the organic EL device.

Figure 17:
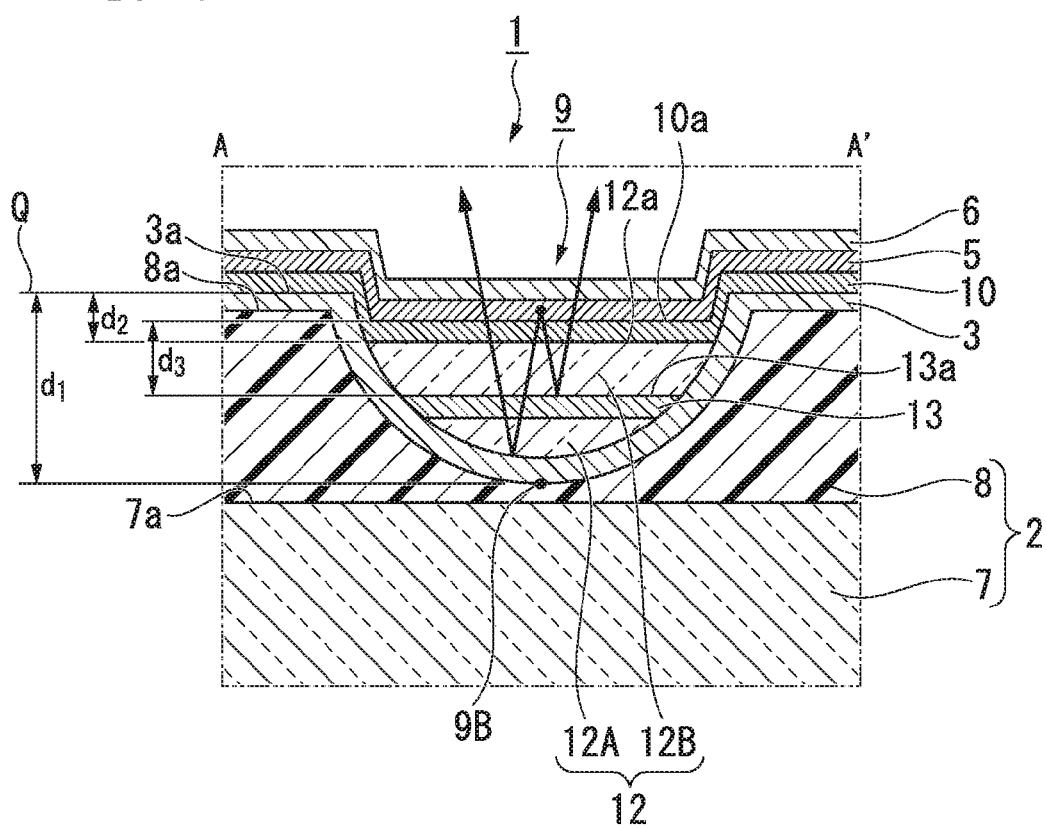

FIG. 17 is a cross-sectional view showing the general constitution of an organic EL device of a fourth embodiment.

FIG. 18(A) is a cross-sectional view showing the relationship between the height and the position of the semi-transmissive/reflective film inside the recess, and (B) is a plan view showing the relationship between the position of the semi-transmissive/reflective film and the surface area.

EMBODIMENTS FOR CARRYING OUT THE INVENTION

First Embodiment

The first embodiment of the present invention will be described below, using FIG. 1 to FIG. 9.

The organic electroluminescence device 1 (hereinafter called an organic EL device 1) of the first embodiment is an example of a top-emission type organic EL device that adopts a microcavity structure.

Figure 1:
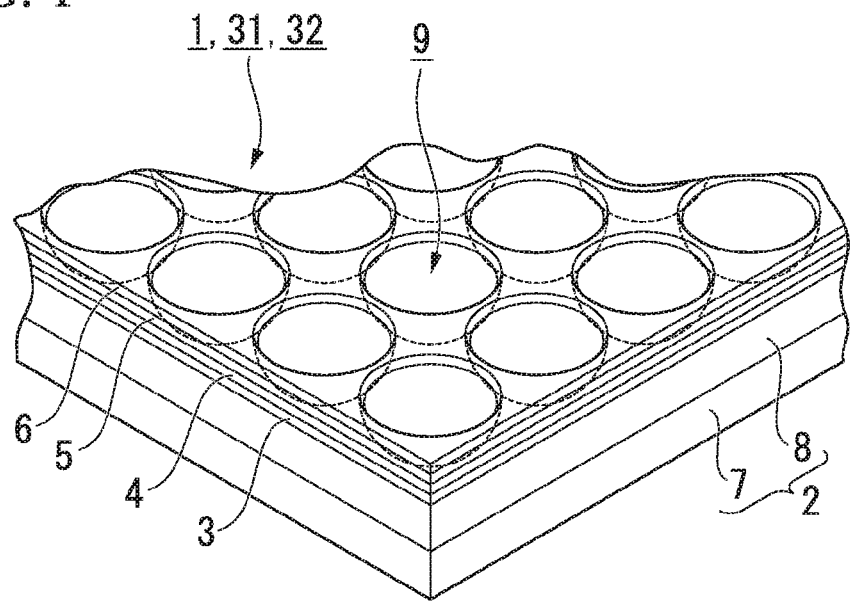
FIG. 1 is an oblique view of an organic EL device of a first embodiment, a second embodiment, and a third embodiment.

FIG. 1 is an oblique view of the organic EL device 1 of the first embodiment.

In the various drawings noted below, as an aid to viewing the constituent elements, some of the constituent elements are shown with different dimensional scale.

As shown in the FIG. 1, the organic EL device 1 of the present embodiment has a base material 2, a reflective layer 3, a first electrode 4, an organic layer 5 that includes a light-emitting layer, and a second electrode 6. The organic EL device 1 is a top-emission type organic EL device, and light shining from the light-emitting layer is radiated from the second electrode 6 side. The base material 2 includes a substrate 7 and an underlayer 8. The underlayer 8, the reflective layer 3, the first electrode 4, the organic layer 5, and the second electrode 6 are laminated on the upper surface of the substrate 7 in sequence from the substrate 7 side. A plurality of recesses 9 are provided in the upper surface (light-emitting surface) of the organic EL device 1.

The organic EL device 1 has, provided at each recess 9, a microcavity structure (hereinafter sometimes referred to as an MC structure) 20 and a light-extraction structure (hereinafter sometimes refer to as an MS structure) 30.

The microcavity structure 20 is constituted by a region sandwiched between a first electrode 4 as an anode and a second electrode 6 as a cathode. The light-extraction structure 30 is constituted by the recess 9 and the reflective layer 3 formed on the surface thereof.

The organic EL device 1 has a plurality of mutually divided unit light-emitting regions 11. The plurality of unit light-emitting regions 11 emit green light. The organic EL device 1, for example, can be used as an illumination device that generates green light. However, the application of the organic EL device 1 is not restricted to an illumination device.

Although the unit light-emitting regions 11 in the present embodiment emit green light, this is not a restriction, and the unit light-emitting regions 11 may be constituted to emit red light or blue light. The constitution may also have a plurality of types of unit light-emitting regions 11 that emit, red light, green light, and blue light, respectively.

For example, if the red light-emitting region, the green light-emitting region, and the blue light-emitting region are made a red subpixel, a green subpixel, and a blue subpixel, the organic EL device 1 can be applied to a display device in which these three subpixels constitute one pixel.

Figure 2:
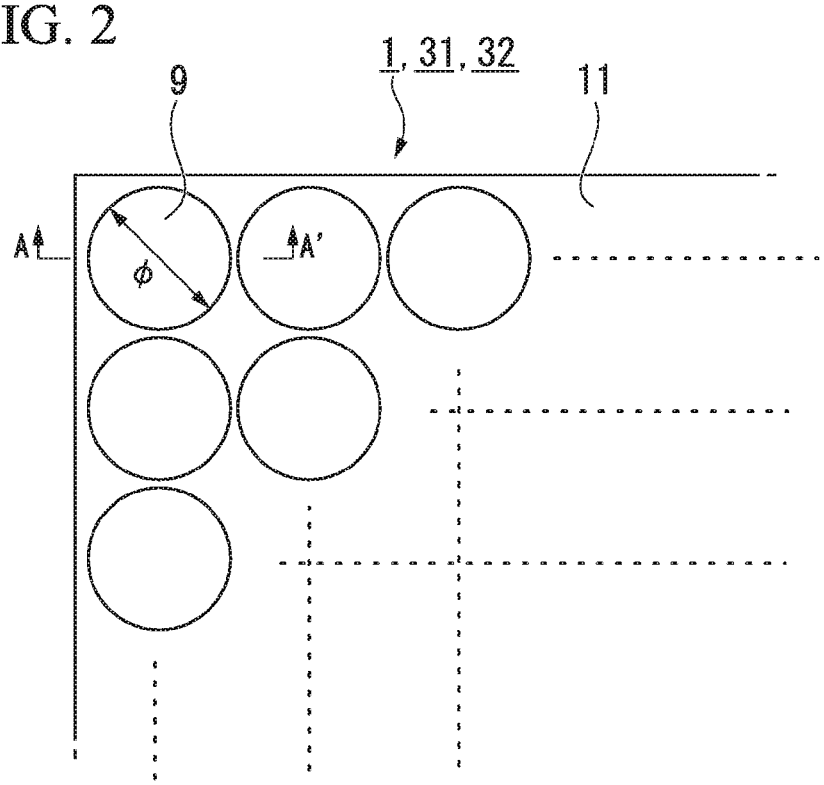
FIG. 2 is an enlarged plan view showing a part of unit light-emitting region.

FIG. 2 is an enlarged plan view showing a part of a unit light-emitting region 11.

Seen from the normal direction to the upper surface of the organic EL device 1, the planar shape of a unit light-emitting region 11 is a square, the length of one side of the square being approximately 2 mm.

As shown in the FIG. 2, a plurality of recesses 9 having circular planar shapes are provided in the unit light-emitting region 11. The diameter ϕ of a recess 9 is, for example, approximately 5 μm. The plurality of recesses 9 are arranged regularly vertically and horizontally, forming a matrix arrangement. The density of the recesses 9 is such that the total surface area of the plurality of recesses 9 occupies approximately 70% of the surface area of the unit light-emitting region 11.

FIG. 3(A) is a cross-sectional view of the organic EL device 1 cut by an arbitrary plane that is perpendicular to the upper surface of the base material 2 along the line A-A of FIG. 2.

As shown in the FIG. 3(A), the underlayer 8 is laminated onto the upper surface 7a of the substrate 7. A glass substrate, for example, is used as the substrate 7. Because the organic EL device 1 is a top-emission type organic EL device, the substrate 7 need not have light transmissivity, and a semiconductor substrate such as a silicon substrate may be used.

A recess 9 that opens toward the top part is provided in the upper surface 8a of the underlayer 8. The cross-sectional shape of the recess 9 is a circular arc. That is, the surface of the recess 9 forms a part of a three-dimensional spherical surface. The underlayer 8 is constituted by a photosensitive resin, for example, by a resin such as an acrylic, a polyimide, or the like. The use of a photosensitive resin as the material of the underlayer 8 is preferable for the method of molding the recess 9, which will be described later. However, if a method of molding other than the method described later is used, the material constituting the underlayer 8 need not have photosensitivity. Additionally, the constituent material of the underlayer 8 need not be a resin, and an inorganic material may be used. Although a base material 2 constituted by the substrate 7 and the underlayer 8 is used in the present embodiment, it is not necessary to use an underlayer, and a recess may be formed in the substrate itself.

The reflective layer 3 is formed on the upper surface 8a of the underlayer 8 that includes the surface of the recess 9. A metal having a high reflectivity, such as aluminum or silver, is preferably used as a constituent material of the reflective layer 3. In the case of the present embodiment, the reflective layer 3 is constituted by, for example, an aluminum film having a film thickness of 100 nm. In the present embodiment, the light-extraction structure 30 is constituted by the recess 9 and the reflective layer 3 formed on the surface thereof.

The filling layer 12 is filled on the inside of the recess 9, with the reflective layer 3 therebetween. The upper surface 12a of the filling layer 12 is at a position that is lower than the plane Q that includes the upper surface 3a of the reflective layer 3. The height from the upper surface 12a of the filling layer 12 to the upper surface 3a of the reflective layer 3 is d2, which in the present embodiment, for example, is set to 0.1 μm. The height from the lowermost base 9B of the recess 9 to the upper surface 3a of the reflective layer 3 is d1. Specific examples of the height d1 will be described later.

Although the upper surface 12a of the filling layer 12 is preferably at a position lower than the plane Q that includes the upper surface 3a of the reflective layer 3, even if the upper surface 12a of the filling layer 12 is at the highest position, it is necessary to be at the same height as the plane Q. Stated conversely, the filling layer 12 is not formed so as to be built upward to above the plane Q. The filling layer 12 is constituted of a resin that has light transmissivity. Specifically, the material used for the filling layer 12 is a resin such as an acrylic, an epoxy, or a polyimide. The refractive index of the filling layer 12 in the present embodiment is, for example, 1.5.

The first electrode 4 is formed over the upper surface 12a of the filling layer 12 and the upper surface 3a of the reflective layer 3. The first electrode 4 has a step at the edge part of the recess 9. Of the first electrode 4, the part positioned over the upper surface 8a of the underlayer 8 contacts a part of the reflective layer 3. At a position on the inside of the recess 9, the lower surface of the first electrode 4 contacts the upper surface 12a of the filling layer 12. Therefore, the lower surface of the first electrode 4 is at a position lower than the plane Q that includes the upper surface 3a of the reflective layer 3.

The first electrode 4 is a transparent electrode constituted by, for example, a film laminate of a transparent conductive film of indium tin oxide (ITO), indium zinc oxide (IZO) or the like and a metal conductive thin film of aluminum or the like, and has light transmissivity and light reflectivity. In the case of the present embodiment, the first electrode 4 is constituted, for example, by ITO of a film thickness of 120 nm and aluminum of a film thickness of 6 nm. Alternatively, the first electrode 4 may be constituted by a metal thin film only. The light transmissivity of the first electrode 4 is 40%. The first electrode 4 functions as an anode for injecting holes into the organic layer.

The organic layer 5 is laminated along the upper surface of the first electrode 4. The organic layer 5 reflects the shape of the first electrode 4 and has a step at the edge part of the recess 9. The organic layer 5, as shown in FIG. 3(B), is a laminate of a hole injection layer 14, a hole transport layer 15, a light-emitting layer 16, an electron transport layer 17, and an electron injection layer 18. The lower surface of the organic layer 5 is at a position that is lower than the plane Q that includes the upper surface 3a of the reflective layer 3. The details of the constitution and functions of the layers that constitute the organic layer 5 will be described later.

The second electrode 6 is laminated along the upper surface of the organic layer 5. The second electrode 6 reflects the shape of the organic layer 5 and has a step at the edge part of the recess 9. The second electrode 6 is a translucent electrode constituted by a metal thin film of, for example, silver, or a magnesium silver alloy. That is, the second electrode 6 has both light transmissivity and light reflectivity, transmitting a part of incident light and reflecting the remainder. The second electrode 6 preferably uses a metal having a small work function, for example Ag, Al, a magnesium alloy (MgAg or the like), or an aluminum alloy (AlLi, AlCa, AlMg, or the like). In the case of the present embodiment, the second electrode 6 is a film laminate of a MgAg alloy of film thickness 1 nm and Ag of film thickness 19 nm. The second electrode 6 functions as a cathode for injecting electrons into the organic layer 5.

In the present embodiment, the region sandwiched between the first electrode 4 and the second electrode 6 forms the microcavity structure 20. A part of the light emitted from the light-emitting layer 16 is multiply reflected between the first electrode 4 and the second electrode 6. When this occurs, of the light emitted from the light-emitting layer 16, a component of a specific wavelength is strengthened. An optical adjustment layer called the cap layer 19 is laminated on the upper surface of the second electrode 6, as shown in FIG. 3(B).

FIG. 3(B) is a cross-sectional view showing the detailed constitution at each unit light-emitting region 11.

Although in the present embodiment a green unit light-emitting region 11G will be discussed, this is not a restriction, and there is no restriction regarding the light emission color or the device structure.

As shown in the FIG. 3(B), the organic layer 5 is provided on a layer above the first electrode 4. The organic layer 5 is constituted by a film laminate in which the hole injection layer 14, the hole transport layer 15, the light-emitting layer 16, the electron transport layer 17, and the electron injection layer 18 are laminated from the first electrode 4 side. However, except for the light-emitting layer 16, insertion may be appropriately done as necessary. Also, a single layer may serve as both a transport layer and an injection layer. In the present embodiment, as described above, the example shown is an organic layer with a five-layer structure of the hole injection layer 14, the hole transport layer 15, the light-emitting layer 16, the electron transport layer 17, and the electron injection layer 18. Additionally, as necessary, a layer such as a hole blocking layer or an electron blocking layer may be added appropriately to block the movement of an electrical charge to the opposite-side electrode.

The hole injection layer 14 has the function of increasing the efficiency of injection of holes into the light-emitting layer 16 from the first electrode 4. Materials used for the hole injection layer 14, for example, are benzine, styrylamine, triphenylamine, porphyrin, triazole, imidazole, oxadiazole, polyaryl alcane, phenylenediamine, aryl amine, oxazole, anthracene, fluorenone, hydrazone, stilbene, triphenylene, azatriphenylene, or a derivative thereof, or a heterocylic conjugate-based monomer, oligomer, polymer, or the like of polysilane-based compound, a vinylcarbazole-based compound, a thiophene-based compound, or an aniline-based compound, with a molybden oxide mixed into these organic materials. The mixture proportion between the organic material and the molybden oxide is, for example, approximately 80% organic material and approximately 20% molybden oxide.

The hole transport layer 15 has the function of increasing the efficiency of hole transport from the first electrode 4 to the light-emitting layer 16. The same type of organic material as the hole injection layer 14 is used in the hole transport layer 15. The hole injection layer 14 and the hole transport layer 15 may be made as one, or may be formed as independent layers.

The light-emitting layer 16 has the function of recombining holes injected from the first electrode 4 side and electrons injected from the second electrode 6 side and emitting light when energy is deactivated. The material of the light-emitting layer 16 is constituted by, for example, a host material and a dopant material. An assist material may also be included. The host material is included with a ratio that is the highest among the constituent materials within the light-emitting layer 16. For example, the mixing proportions of the host material and the dopant material are approximately 90% host material and approximately 10% dopant material. The host material has the function of facilitating film growth of the light-emitting layer 16 and maintaining the light-emitting layer 16 in the condition of a film. It is therefore desired that the host material be a stable compound that resists crystallization and chemical change after film growth. When an electrical field is applied between the first electrode 4 and the second electrode 6, it also has the function, when carriers are recombined within host molecules, of moving excitation energy in the dopant material and causing the dopant material to emit light. The thickness of the light-emitting layer 16 is, for example, approximately 60 nm.

The specific materials of the light-emitting layer 16 include a material having a high light-emitting efficiency, such as a low molecular weight fluorescent dye, a fluorescent polymer or metal complex. Materials of the light-emitting layer 16 that can be cited include anthracene, naphthalene, indene, phenanthrene, pyrene, naphthacene, triphenylene, anthracene, perylene, picene, fluoranthene, acephenanthrylene, pentaphene, pentacene, coronene, butadiene, coumarin, acridine, stilbene or a derivative thereof, tris (8-quinolinolato) aluminum complex, bis (benzoquinolinolato) beryllium complex, tri (dibenzoylmethyl) phenanthroline europium complex, and di-tolyl vinyl biphenyl or the like.

The electron transport layer 17 has a function of increasing the electron transport efficiency from the second electrode 6 to the light-emitting layer 16. Materials of that can be used as the material of the electron transport layer 17 include, for example, quinoline, perylene, phenanthroline, bis(styryl), pyrazine, triazole, oxazole, oxadiazole, fluorenone, or a derivative or complex of these. Specifically, tris (8-hydroxyquinoline) aluminum, anthracene, naphthalene, phenanthrene, pyrene, anthracene, perylene, butadiene, coumarin, acridine, stilbene, 1,10-phenanthrorine, or a derivative or metal complex of these. The thickness of the electron transport layer 17 is, for example, approximately 15 nm.

The electron injection layer 18 has the function of increasing the efficiency of injecting electrons from the second electrode 6 to the light-emitting layer 16. The material used for the electron injection layer 18 is, for example, metallic calcium (Ca), or a compound such as lithium fluoride (LiF). The electron transport layer 17 and the electron injection layer 18 may be made as one, or may be formed as independent layers. The thickness of the electron injection layer 18 is, for example, approximately 0.5 nm.

The microcavity structure 20 has the effect of strengthening light at a specific wavelength, by using the resonance of light occurring between the first electrode 4 and the second electrode 6. In the case of the present embodiment, the wavelength of the light emitted from each of the green unit light-emitting regions 11G is the same. The length of the light path between the first electrode 4 and the second electrode 6 corresponds to the spectral peak wavelength of green.

Although there are various methods of setting the light path length of the microcavity structure 20 of the green unit light-emitting regions 11G, in this case, from the standpoint of suppressing the resistance value as much as possible, the method of setting by the layer thickness $t_{HIL-G}$ of the hole injection layer 14 is adopted.

By the microcavity structure 20, the light emitted from the organic layer 5 repeats reflections within a prescribed optical length between the first electrode 4 and the second electrode 6, with resonance and strengthening of light of the specific wavelength corresponding to the light path length and light of wavelengths not corresponding to the light path length being weakened. Thus, the spectrum of light extracted to the outside is sharp and is of high intensity, thereby improving the luminance and color purity.

Regarding the constituent material of the light-emitting layer 16, a light-emitting material that emits green light is used for the unit light-emitting regions 11G. In the present embodiment, bipolar material is used as the host material in all the unit light-emitting regions 11G. A phosphorescent material is used as the dopant material in the unit light-emitting regions 11G. The thickness of the light-emitting layer 16 is, for example, approximate 60 nm.

Alternatively, the same light-emitting material that emits white light may be used in all the unit light-emitting regions 11G. In this case as well, green light is emitted from the unit light-emitting regions 11G.

The cap layer 19 is laminated on the upper surface of the second electrode 6. The cap layer 19 functions as a protective layer that protects the second electrode 6 and also functions as an optical adjustment layer. A color filer may be added on a layer above the second electrode 6. By the light emitted from the organic layer 5 passing through the color filter, it is possible to increase the color purity.

A specific example of the constitution of the organic EL device 1 is as shown in Table 1.

TABLE 1

| | Green light-emitting element |
|---|---|
| Anode | Al: 6 nm, ITO: 120 nm |
| Hole injection layer | Organic HTL material (80%):MoOx (20%) 70 nm |
| Hole transport layer | Organic HTL material 10 nm |
| Light-emitting layer | H (90%):d (10%) |
| | 60 nm |
| | H: Bipolar material |
| | d: Phosphorescent material |
| Electron transport layer | Organic ETL material |
| | 15 nm |
| Electron injection layer | LiF |
| | 0.5 nm |
| Cathode | MgAg 1 nm/Ag 19 nm |
| Cap layer | 78 nm |

Light-emitting layer H (host material), d (dopant material)

The manufacturing process for the above-noted organic EL device 1 is described below, using FIG. 4 to FIG. 7.

First, as shown in FIG. 4(A), a positive-type photosensitive resin material is coated onto the upper surface 7a of the substrate 7 to form the resin layer 23.

Next, as shown in FIG. 4(B), the resin layer 23 is exposed via a photomask 24. When this is done, the photomask 24 that has a prescribed light-transmission amount distribution, such as a gray tone mask, is used. Specifically, the photomask 24 is such that the light transmission amount is large at the near the center of a circular pattern and the light transmission amount decreases with movement toward the peripheral part. By doing this, in the resin layer 23, the exposure amount is large near the center of the circular pattern and the exposure amount decreases moving toward the peripheral part.

Next, as shown in FIG. 4(C), the resin layer 23 is developed using a prescribed developer. When this is done, depending upon the difference in the exposure amount of the resin layer 23, the amount of film reduction of the resin layer 23 is large near the center of a circular pattern and becomes smaller moving toward the peripheral part. This forms a recess 9 with an arc-shaped cross-section in the resin layer 23 and forms the underlayer 8.

Next, as shown in FIG. 4(D), a metal such as aluminum is deposited over the entire surface of the underlayer 8, thereby forming the reflective layer 3.

Next, three methods of forming the filling layer 12 can be cited as examples.

These methods of forming the filling layer 12 are described below.

The first filling layer forming method is as follows.

First, as shown in FIG. 5(A), a resin film 25 made of acrylic, epoxy, polyimide or the like is formed over the entire surface of the reflective layer 3. The method of forming the resin film 25 is, for example, a method such as using spin-coating or bar-coating to coat a liquid resin material onto the reflective layer 3. When this is done, the thickness of the resin film 25 is set so that the resin film 25 fills the recess 9 and also covers the flat part of the reflective layer 3.

Next, as shown in FIG. 5(B), using the method, for example, of plasma ashing (dry ashing) or the like, the entire surface of the resin film 25 is made the etch back. When this is done, the etch bottom amount is adjusted so that the upper surface 25a of the resin film 25 reaches to a position below the plane Q that includes the upper surface 3a of the reflective layer 3. This forms the filling layer 12.

Next, as shown in FIG. 5(C), the first electrode 4, the organic layer 5, and the second electrode 6 are sequentially formed on the upper surface 3a of the reflective layer 3 and on the upper surface 12a of the filling layer 12. The first electrode 4, the organic layer 5, and the second electrode 6 are formed by known processes. For example, patterning may be formed using vacuum deposition that uses a shadow mask, although this is not a restriction, and the spray method, the injection method, the printing method, or the laser transfer method or the like can be used.

The second filling layer forming method is as follows.

As shown in the FIG. 6(A), a resin film 25 made of acrylic, epoxy, polyimide or the like is formed over the entire surface of the reflective layer 3. This process step is the same as in the first filling layer formation method shown in FIG. 5(A).

Next, as shown in FIG. 6(B), a squeegee 27 is used to planarize the entire surface of the resin film 25. When this is done, the squeegee 27 is moved along the upper surface 3a of the reflective layer 3 so that the upper surface 25a of the resin film 25 after the passage of the squeegee 27 is on the same plane as the plane Q that includes the upper surface 3a of the reflective layer 3.

Next, as shown in FIG. 6(C), the base material on which the resin film 25 remains in the recess 9 is baked. As a result of baking, the volume of the resin film 25 shrinks, and the upper surface 25a of the resin film 25 is at a position lower than the plane Q that includes the upper surface 3a of the reflective layer 3. This forms the filling layer 12.

Next, as shown in FIG. 6(D), the first electrode 4, the organic layer 5, and the second electrode 6 are sequentially formed on the upper surface 3a of the reflective layer 3 and on upper surface 12a of the filling layer 12. This process step is the same as the first filling layer forming method shown in FIG. 5(C).

The third filling layer formation method is as follows.

As shown in the FIG. 7(A), a resin film 25 made of acrylic, epoxy, polyimide, or the like is laminated onto the surface of the reflective layer 3 that corresponds to the inside of the recess 9. The method used to form the resin film 25 is, for example, to use the inkjet method to coat a liquid resin material onto the reflective layer 3. When this is done, the amount of resin material ejected from the inkjet head 29 is adjusted so that the upper surface 25a of the resin film 25 is at a position lower than the plane Q including the upper surface 3a of the reflective layer 3. This forms the filling layer 12.

Next, as shown in FIG. 7(B), the first electrode 4, the organic layer 5, and the second electrode 6 are sequentially formed on the upper surface 3a of the reflective layer 3 and on the upper surface 12a of the filling layer 12. This process step is the same as the first filling layer forming method shown in FIG. 5(C).

The above process finishes the organic EL device 1 of the present embodiment.

FIG. 8(A) is a cross-sectional view showing a conventional organic EL device 101.

The organic EL device 101 is constituted by the sequential lamination of a reflective layer 103, a first electrode 104, an organic layer 105, and a second electrode 106 onto a substrate 102. In the organic EL device 101, light emitted from a light-emitting layer in the organic layer 105 is emitted uniformly in all directions, and proceeds internally as it is refracted at the boundaries between each of the layers that have different refractive indexes. The light that has progressed through the substrate 102 is reflected by the reflective layer 103.

Because there is a difference in the refractive index at the boundary between the second electrode 106 and the external space (air), light that strikes this boundary at a small angle of incidence is emitted to the external space, and light that strikes at a large angle of incidence is reflected at the boundary and proceeds again internally. For example, it is difficult for the light L1 emitted at a direction close to straight sideways from an arbitrary light-emitting point M within the organic layer 105 to exit to the external space, even if it is refracted at an interlayer boundary and the angle changes somewhat.

In the path travelled by light within the organic EL device 101, no loss occurs by reflection of light at the boundary between the second electrode 106 and the external space (air). In contrast, at the boundary between the first electrode 104 and the reflective layer 103, because the reflectivity of the metal that constitutes the reflective layer 103 is generally not 100%, loss occurs because of the light reflection. Additionally, a part of the light is absorbed by various layers as it progresses through the inside of the organic EL device 101. Therefore, the light is attenuated as it progresses through the inside of the organic EL device 101. The refractive index of the organic layer 105 is usually approximately 1.8, in which case, of the light emitted from the light-emitting layer, a proportion of light of approximately 20% is extracted to the external space. In this manner, the conventional organic EL device 101 has a problem of a low light usage efficiency.

In contrast, in the organic EL device 1 of the present embodiment, as shown in FIG. 8(B), the first electrode 4 has both light transmissivity and light reflectivity. For that reason, a part of the light emitted from the light-emitting layer 16 in the organic layer 5 is passed, and the remainder is reflected.

As shown in the FIG. 8(B), the reflective layer 3 in the present embodiment is curved along the recess 9. For that reason, light that has passed through the first electrode 4 is reflected at the reflective layer 3, the direction of travel thereof being changed, and it progresses through the inside of the organic EL device 1. When this occurs, even if there would have been a large angle of incidence with respect to the boundary between the second electrode 6 and the external space (air), light that has been converted by reflection at the reflective layer 3 to an angle of incidence smaller than the critical angle at the boundary between the second electrode 6 and the external space is extracted to the external space.

In the case of the present embodiment in particular, as described above, the upper surface 12a of the filling layer 12 is at a position lower than the plane Q that includes the upper surface 3a of the reflective layer 3 and also the lower surface 5b of the organic layer 5 is at a position lower than the plane Q. That is, the reflective layer 3 exists on the sides (left and right directions in FIG. 8(B)) of the organic layer 5 in the inside of the recess 9. For that reason, for example, the light L1 emitted in a direction close to straight sideways from an arbitrary light-emitting point M within the organic layer 5 is reflected at the reflective layer 3 and the angle of the direction of its travel changes. Thus, in contrast to the conventional organic EL device 101 shown in FIG. 8(A), even for the light L1 emitted in a direction close to straight sideways from the light-emitting point M, after reflection at the reflective layer 3, when the light strikes the boundary between the second electrode 6 and the external space at an angle of incidence smaller than the critical angle, it can be extracted to the external space. Doing this enables the provision of an organic EL device 1 having superior light usage efficiency.

In the present embodiment, because the upper surface 12a of the filling layer 12 is at a position lower than the plane Q and also the lower surface 5b of the organic layer 5 is at a position lower than the plane Q, even light emitted substantially straight sideways from the light-emitting point M in the organic layer 5 can strike the reflective layer 3. However, were the upper surface 12a of the filling layer 12 to be one the same plane as the plane Q, the lower surface 5b of the organic layer 5 would be at a position higher than the plane Q. In such a case, because the reflective layer 3 does not exist on the sides of the organic layer 5 positioned on the inside of the recess 9, light emitted substantially straight sideways from the light-emitting point M inside the organic layer 5 would not strike the reflective layer 3. Even in that case, however, compared with the conventional organic EL device 101, the proportion of light emitted within a prescribed angle range near straight sideways from the light-emitting point M in the organic layer 5 that strikes the reflective layer 3 is sufficiently increased. Therefore, even with this constitution, an organic EL device with superior light usage efficiency can be provided.

The remaining light of the light emitted from the light-emitting layer inside the organic layer 5 that does not pass through the first electrode 4 is repeated reflected between the first electrode 4 and the second electrode 6, with resonance and strengthening of light of a specific wavelength corresponding to the light path and light of wavelengths not corresponding to the light path length being weakened. As a result, the spectrum of light extracted to the outside is sharp and is of high intensity, thereby improving the luminance and color purity.

In this manner, in the organic EL device 1 of the present embodiment, because it is possible to achieve both an improvement of the light extraction efficiency and an improvement of the color purity, it is possible to arbitrarily adjust the light extraction efficiency and the color purity.

To verify the effect of the organic EL device 1 of the present embodiment, which has a light extraction structure and a microcavity structure, the inventors have fabricated three types of organic EL devices, a bottom-emission-structure organic EL device, a light extraction structure (hereinafter MS structure) organic EL device, and a microcavity structure (hereinafter MC structure) organic EL device, and compared the optical characteristics of each. All the organic EL devices had green light-emitting elements.

The results are noted below.

In the organic EL device 1 of the present embodiment and the light extraction structure organic EL device, the central angles θ of the arcs, which are the cross-sectional shapes of the recesses 9, are all the same.

As shown in the FIGS. 9(A) and (B), the diameter φ of the circle when the recess 9 is seen in plan view is kept constant and the cross-sectional shape of the recess 9 is made an arc shape. Therefore, the depth d1 of the recess 9 is shown by the central angle θ of the arc. That is, if the depth d1 of the recess 9 is deep, the central angle θ is large, and if the depth d1 of the recess 9 is shallow, the central angle is small. The central angles θ of the arc of the recesses 9 of the organic EL device 1 of the present embodiment and the light extraction structure organic EL device are 90°.

Regarding the optical characteristics, a spectroradiometer has been used to measure the frontal luminance of light emitted from each of the organic EL devices, and an integrating sphere has been used to measure the intensity of the total light flux intensity.

The peak intensity, frontal irradiation intensity, luminance, and the color purity (x, y) of light irradiated from the organic EL device 1 of the present embodiment and the above-noted three types of organic EL devices are indicated in Table 2.

In Table 2, taking a bottom-emission structure organic EL device values as references, the relative intensities of the other organic EL devices are indicated.

TABLE 2

|  |  | Reference bottom-emission structure | Microcavity (MC) structure | Light extraction (MS) structure | MC + MS structure |
|---|---|---|---|---|---|
| Peak intensity |  | 1 | 2.5 | 2.1 | 2.1 |
| Irradiation intensity |  | 1 | 0.98 | 2.1 | 1.3 |
| Luminance |  | 1 | 1.11 | 2.1 | 1.4 |
| Color | x | 0.38 | 0.23 | 0.38 | 0.31 |
| purity | y | 0.59 | 0.72 | 0.59 | 0.67 |

FIG. 10 is a graph showing the frontal irradiation intensity in the bottom-emission structure organic EL device and the light extraction structure organic EL device. The horizontal axis represents wavelength (nm), and the vertical axis represents intensity. In the drawing, the bottom-emission structure is indicated by BE, and the light extraction structure is indicated by MS.

As can be understood from the results of FIG. 10 and Table 2, compared with the bottom-emission structure organic EL device, in the case of the light extraction (MS) structure organic EL device, because of the recess 9, the light peak intensity (total light flux intensity) and the frontal irradiation intensity are increased by 2.1 times. Because the light extracted from the light-extraction structure organic EL device is a synthesized light taking complex light paths, the interference effect is neutralized. For that reason, the light emission spectrum of the light extraction structure organic EL device is the same as the light emission spectrum of the bottom-emission structure organic EL device.

That is, with the light extraction structure organic EL device, compared with the bottom-emission structure organic EL device, although the intensity can be improved, there is absolutely no improvement in the color purity.

FIG. 11 is a graph showing the frontal irradiation intensity in the bottom-emission structure organic EL device and the microcavity structure organic EL device. The horizontal axis represents wavelength (nm) and the vertical axis represents intensity. In the drawing, the bottom-emission structure is indicated by BE, and the microcavity structure is indicated by MC.

As can be understood from the results of FIG. 11 and Table 2, compared with the bottom-emission structure organic EL device, in the case of the microcavity structure (MC) structure organic EL device, because of the microcavity effect, the light peak intensity is increased by 2.5 times.

The light emitted from the microcavity structure organic EL device has a sharp spectrum. That the spectrum of the irradiated light becomes sharp means that the irradiation intensity is strengthened. That is, it is possible to increase the color purity.

However, the amount of energy released (the surface area of the light emission spectrum of the microcavity structure organic EL device in FIG. 11) itself is substantially the same as that of the bottom-emission structure organic EL device, so that there is almost no improvement. That is, compared with the bottom-emission structure organic EL device, the intensity is not very improved. This is because, of the broad light emission spectrum, for the purpose of increasing the color purity, light of the wavelength 530 nm is amplified by the microcavity effect.

As can be understood from Table 2, with the microcavity structure organic EL device, compared with the bottom-emission structure organic EL device, although the color purity can be improved, there is almost no improvement of the intensity. That is, if the focus is on color purity an improvement in intensity cannot be expected. However, by amplifying a light of a wavelength at which visual sensitivity is good using the microcavity effect, the luminance can be improved even if there is only a microcavity structure.

The organic EL device 1 of the present embodiment, by making the first electrode 4 a partially transmissive reflective film, it can cause the light extraction effect and the microcavity effect simultaneously.

The characteristics of the first electrode 4 will now be discussed.

FIG. 12 shows the relationship between the film thickness and the light transmissivity of the first electrode 4. The horizontal axis represents the film thickness (nm) of the first electrode 4 and the vertical axis represents the light transmissivity (%) of the first electrode 4.

As shown in the FIG. 12, the thicker is the film thickness of the first electrode 4, the greater is the reduction in the light transmissivity of the first electrode 4. If the amount of light passing through the first electrode 4 decreases and the light reflected at the first electrode 4 increases, because the microcavity effect is intensified, the color purity can be improved. Conversely, the luminance and irradiation intensity of the organic EL device 1 decrease.

In this manner, by adjusting the ratio between the light extraction effect and the microcavity effect in accordance with the film thickness of the first electrode 4, the light emission of the organic EL device 1 can be controlled.

With the organic EL device 1 of the present embodiment, to cause both the light extraction effect and the microcavity effect simultaneously, a first electrode 4 constituted by an aluminum film having a film thickness of 6 nm and a light transmissivity of 40% is used.

As can be understood from FIG. 13 and Table 2, the organic EL device 1 of the present embodiment, in addition to obtaining a peak intensity that is the same as the light extraction structure organic EL device, obtains a luminance that is higher than that of the microcavity structure organic EL device. Also, compared with the bottom-emission structure organic EL device, because the y value in the chromaticity coordinate is increased, it can be said that the color purity is improved.

In this manner, it has been verified that, according to the organic EL device 1 of the present embodiment, by making the first electrode 4 a partially transmissive reflective film, improvements in both the color purity effect by the microcavity structure and the light extraction efficiency by light extraction structure, that is, in luminance effect can be obtained simultaneously.

Although specific values for a green light-emitting element have been shown in the present embodiment, the same results have been achieved regarding a red light-emitting element and a blue light-emitting element.

Organic EL devices of the second embodiment and the third embodiment will be described below.

Second Embodiment

Figure 3:
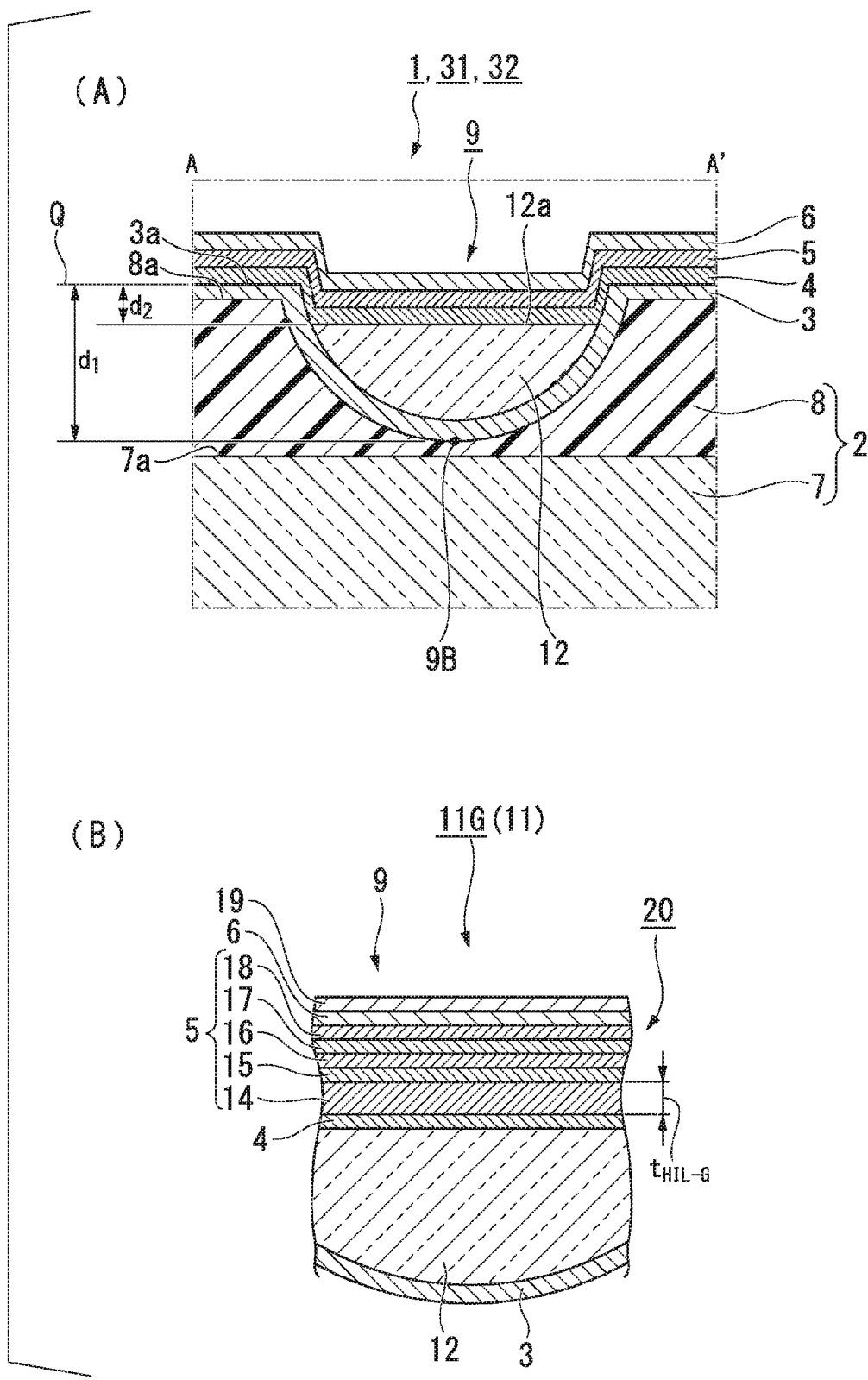
FIG. 3(A) is a cross-sectional view of the organic EL device cut by an arbitrary plane that is perpendicular to the upper surface of the base material along the line A-A' of FIG. 2.
FIG. 3(B) is a cross-sectional view showing the detailed constitution at each unit light-emitting region.
Figure 4:
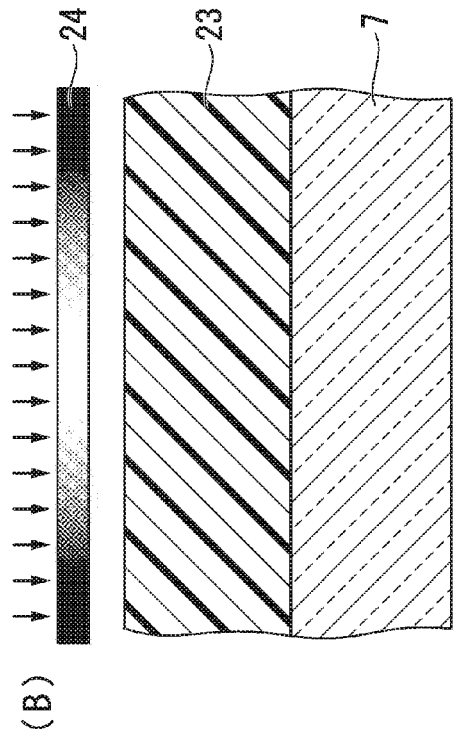
Figure 4:
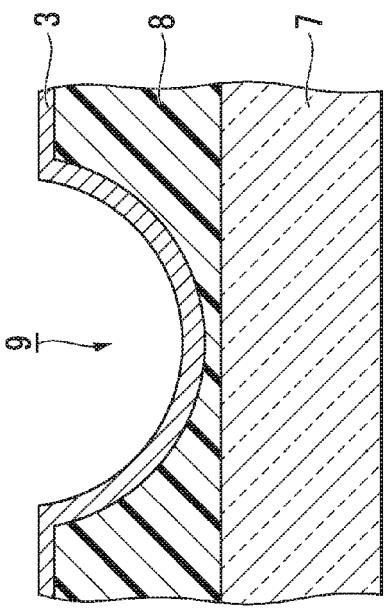
Figure 4:
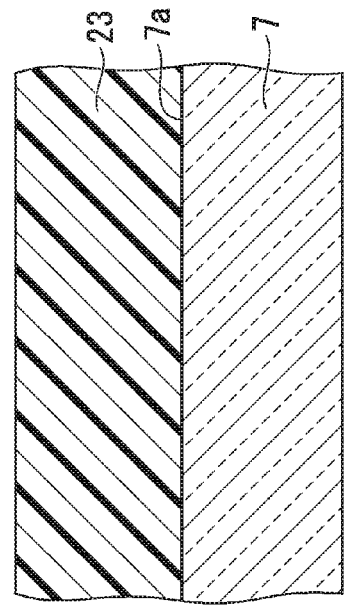
Figure 4:
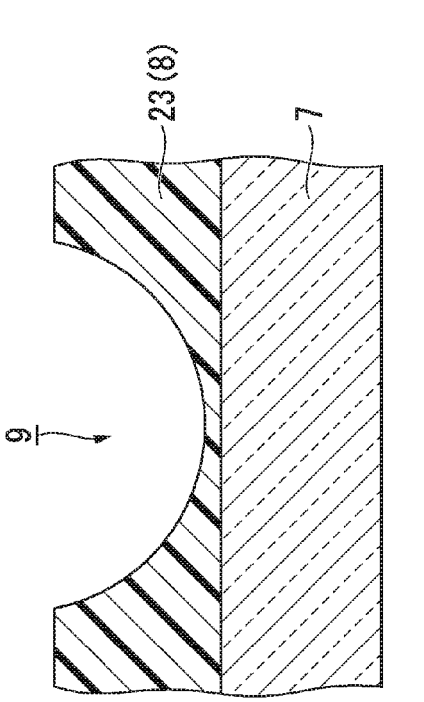

The second embodiment of the present invention will be described below using FIG. 1 to FIG. 3.

Although the basic constitution of the organic EL device of the second embodiment is the same as that of the first embodiment, the film thickness of the first electrode 4 is different from the first embodiment.

The constituent elements that differ from the first embodiment will be described below in detail, the descriptions of common constituent elements being omitted.

In the first embodiment, a metal thin-film having a film thickness of 6 nm has been used as the first electrode 4. In contrast, in the organic EL device 31 of the present embodiment, a metal thin-film of aluminum or the like having a film thickness of at least 2 nm and less than 6 nm is used. Other constituent elements are the same as in the first embodiment.

As described above, a parameter that expresses the light transmissivity of the first electrode 4 is the film thickness. The smaller is the thickness, the higher is the transmissivity, and the larger is the thickness, the lower is the transmissivity.

Specifically, in the present embodiment, the film thickness of the first electrode 4 is 3 nm. The transmissivity of the 3-nm-thick first electrode 4 is 63%. By increasing the light transmissivity of the first electrode 4, compared with the organic EL device 1 of the first embodiment, the light that strikes the reflective layer 3 of the light extraction structure 30 increases. If the amount of light extracted to the outside by reflection increases, the luminance is improved over the organic EL device 1 of the first embodiment.

According to the organic EL device 31 of the present embodiment, by making the film thickness of the first electrode 4 be 3 nm to increase the light transmissivity to 63%, compared with the organic EL device 1 of the first embodiment, the light extraction efficiency is improved. Accompanying an improvement of the light extraction efficiency, although the microcavity effect is further reduced from that of the first embodiment, an organic EL device 31 with a higher luminance is obtained.

Third Embodiment

The third embodiment of the present invention will be described below, using FIG. 1 to FIG. 3.

Although the basic constitution of the organic EL device of the third embodiment is the same as the first and second embodiments, the point of using an electrode as the first electrode 4 having a film thickness that is even thinner than that of the second embodiment is different.

The constituent elements that differ from the first embodiment will be described below in detail, the descriptions of common constituent elements being omitted.

As the first electrode 4, a metal thin-film having a film thickness of 6 nm has been used in the first embodiment, and a metal thin-film having a film thickness of 3 nm has been used in the second embodiment. In contrast, in the organic EL device 32 of the present embodiment, a metal thin-film of aluminum or the like having a film thickness of 1 nm is used as the first electrode 4. Other constituent elements are the same as in the first embodiment.

Specifically, in the present embodiment, the film thickness of the first electrode 4 is 1 nm. The transmissivity of the 1-nm-thick first electrode 4 is 86%. By making the first electrode 4 have an even thinner film thickness, compared with the organic EL device 31 of the second embodiment, the light striking the reflective layer 3 of the light extraction structure 30 is further increased. This improves the luminance over the second embodiment.

According to the organic EL device 32 of the present embodiment, by making the film thickness of the first electrode 4 be 1 nm to increase the light transmissivity to 86%, compared with the organic EL device 31 of the second embodiment, the light extraction efficiency is further improved. Accompanying the further improvement of the light extraction efficiency, although the microcavity effect is reduced compared with the first embodiment, an organic EL device 32 with a higher luminance is obtained.

To verify the effect of the organic EL devices of the second embodiment and the third embodiment, the present inventors have used the organic EL devices of the above-described first embodiment and the above-described three types of organic EL devices, comparing the microcavity effect and the light extraction effect.

Table 3 shows the peak intensity, the frontal irradiation intensity, the luminance, and the color purity (x, y) of light irradiated from the organic EL devices of the first embodiment, the second embodiment, and the third embodiment.

In Table 3, relative intensities are indicated, with values for a bottom-emission structure organic EL device taken as references.

TABLE 3

| | | | | MC + MS structure | | |
|---|---|---|---|---|---|---|
| | Reference bottom emission structure | Microcavity (MC) structure | Light extraction (MS) structure | Film thickness 6 nm Transmissivity 40% | Film thickness 3 nm Transmissivity 63% | Film thickness 1 nm Transmissivity 86% |
| Peak intensity | 1 | 2.5 | 2.1 | 2.1 | 2 | 2 |
| Irradiation intensity | 1 | 0.98 | 2.1 | 1.3 | 1.4 | 1.8 |
| Luminance | 1 | 1.11 | 2.1 | 1.4 | 1.5 | 1.8 |
| Color purity x | 0.38 | 0.23 | 0.38 | 0.31 | 0.33 | 0.36 |
| Color purity y | 0.59 | 0.72 | 0.59 | 0.67 | 0.64 | 0.62 |

FIG. 14 shows the light emission spectra of each of the organic EL devices of the first embodiment (40% light transmissivity), the second embodiment (63% light transmissivity), the third embodiment (86% light transmissivity), the bottom-emission structure, the microcavity (MC) structure, and the light extraction (MS) structure. The horizontal axis represents wavelength (nm), and the vertical axis represents spectrum intensity.

As is clear from Table 3 and FIG. 14, the organic EL device 31 of the second embodiment having a first electrode 4 with a film thickness of 3 nm has a higher light transmissivity in the first electrode 4 compared with the organic EL device 1 of the first embodiment having a first electrode 4 with a film thickness of 6 nm, and light extraction efficiency is improved. The organic EL device 32 of the third embodiment having a first electrode 4 with a film thickness of 1 nm has a further increased light transmissivity in the first electrode 4 and an even further improved light extraction efficiency.

Accompanying the improvement of the light transmissivity of the first electrode 4 by thinning of the film, the amount of light reflected in the first electrode 4, that is, the amount of light strengthened by the microcavity effect is reduced in comparison with that of the first embodiment, and the value representing the color purity is lower than that of the organic EL device 1 of the first embodiment. That said, the color purity is higher than that of the bottom-emission structure organic EL device or the organic EL device having only a light extraction structure, and compared with these, the organic EL devices 31 and 32 of the second embodiment and the third embodiment have improved color purity.

FIG. 15 shows the relationship between the light transmissivity (%) that changes in accordance with the film thickness of the first electrode 4 and the xy chromaticity chart.

As shown in FIG. 15, in the case of a microcavity structure in which the first electrode 4 has only light reflectivity (0% light transmissivity), of the light emitted from the light-emitting layer 16, all the light striking the first electrode 4 is reflected at the first electrode 4. For that reason, it can be seen that this is an organic EL device with a large microcavity effect and high color purity.

In contrast, in the case of a light extraction structure in which the first electrode 4 has only light transmissivity (100% light transmissivity), of the light emitted from the light-emitting layer 16, all the light striking the first electrode 4 is transmitted through the first electrode 4, and there is no reflected light. For that reason, the microcavity effect cannot be obtained, and the color purity of low.

In the first embodiment (40% light transmissivity), the second embodiment (63% light transmissivity), and the third embodiment (86% light transmissivity) as well, the lower is the light transmissivity, the larger is the y value, and the higher is the color purity.

Thus, according to FIG. 15, it can be seen that, as the light transmissivity of the first electrode 4 is reduced, the microcavity effect by light reflection improves, and the color purity increases.

FIG. 16 shows the relationship between the film thickness of the first electrode 4 and the luminance of the organic EL device, in which the horizontal axis represents light transmissivity (%), and the vertical axis represents the luminance ratio (contrast ratio) between white and black.

As shown in FIG. 16, in the case of light extraction structure in which the first electrode 4 has only light transmissivity (100% transmissivity), of the light emitted from the light-emitting layer 16, all the light that strikes the first electrode 4 is transmitted through the first electrode 4. For that reason, it can be seen that the organic EL device has a high light extraction efficiency and high luminance. That is, the organic EL device is superior in luminance, rather than color purity.

In the first embodiment (40% light transmissivity), the second embodiment (63% light transmissivity), and the third embodiment (86% light transmissivity) as well, the higher is the light transmissivity, the greater is the improvement of the luminance ratio.

Thus, according to FIG. 16, it can be seen that, as the light transmissivity of the first electrode 4 increases, the light extraction effect increases, and the contrast improves.

As described above, the light extraction effect and the microcavity effect are conflicting effects, and are caused by the optical characteristics (light transmissivity and light reflectivity) of the first electrode 4. That is, the film thickness of the first electrode 4 is ultimately linked to the optical characteristics of the organic EL device.

In this manner, the ratio between the light extraction effect and the microcavity effect can be adjusted by the film thickness of the first electrode 4, thereby enabling light emission control of the organic EL device.

From the above, it is desirable that, from the tradeoff between color purity and contrast, the film thickness of the first electrode 4 (light transmissivity and light reflectivity) is determined to obtain an organic EL device 32 that exhibits the desired characteristics.

Fourth Embodiment

The constitution of an organic EL device of the fourth embodiment will be described below, using FIG. 17.

The organic EL device 33 of the fourth embodiment is different from the first embodiment in having a first electrode 10 having only light transmissivity and a semi-transmissive/reflective film 13.

The constituent elements that differ from the first embodiment will be described below in detail, the descriptions of common constituent elements being omitted.

The first electrode 10 of the present embodiment is a transparent electrode constituted by a transparent conductive film of, for example, indium tin oxide (ITO), and indium zinc oxide (IZO), and has light transmissivity. In the case of the present embodiment, the first electrode 10 is constituted, for example, by ITO having a film thickness of 120 nm. The first electrode 10 functions as an anode for injecting holes into the organic layer.

The semi-transmissive/reflective film 13 has both light transmissivity and light reflectivity, passing a part of the incident light and reflecting the remainder. The semi-transmissive/reflective film 13 is provided, along with the filling layer 12, on the inside of the recess 9. The filling layer 12 in the present embodiment has a first filling layer 12A and a second filling layer 12B. The first filling layer 12A, the semi-transmissive/reflective film 13, and the second filling layer 12B are laminated in that sequence, starting from the bottom side, inside the recess 9. The semi-transmissive/reflective film 13 is disposed between the first filling layer 12A and the second filling layer 12B that constitute the filling layer 12, and forms a laminate structure with those films. The upper surface 13a of the semi-transmissive/reflective film 13 is parallel to the upper surface 7a of the substrate 7.

The semi-transmissive/reflective film 13 need not have a laminate structure with the first filling layer 12A and the second filling layer 12B, and may be constituted by the entire semi-transmissive/reflective film 13 being buried inside the filling layer 12.

In this case, the height from the lowermost base 9B of the recess 9 to the upper surface 3a of the reflective layer 3 is taken to be d1. As noted in the first embodiment, the depth d1 of the recess 9 is shown by the central angle θ of the arc. The central angle of the arc of the recess 9 in the present embodiment is that same as the other embodiments, this being θ=90°.

The height from the upper surface 12a of the filling layer 12 to the upper surface 3a of the reflective layer 3 is taken to be d2. In the present embodiment, the height d2 is set to, for example, 0.1 mm. The height from the upper surface 13a of the semi-transmissive/reflective film 13 to the upper surface 10a of the first electrode 10 is taken to be d3.

In the organic EL device 33 of the present embodiment, light emitted from the light-emitting layer of the organic layer 5 passes through the first electrode 10 and the second filling layer 12B and strikes the semi-transmissive/reflective film 13. Light that has passed through the semi-transmissive/reflective film 13 is reflected by the reflective layer 3, the direction of travel thereof being changed, and progresses through the inside of the organic EL device. When this occurs, even if there would have been a large angle of incidence with respect to the boundary between the second electrode and the external space (air), by reflection at the reflective layer 3 light that has been converted to an angle of incidence smaller than the critical angle at the boundary between the second electrode 6 and the external space by the reflection at the reflective layer 3 is extracted to the external space.

Of the light emitted from the light-emitting layer of the organic layer 5, the light reflected at the semi-transmissive/reflective film 13 is repeatedly reflected between the semi-transmissive/reflective film 13 and the second electrode 6, with resonance and strengthening of light of a specific wavelength corresponding to the light path length, and light of a wavelength not corresponding to the light path length being weakened. As a result, the luminance and the color purity are improved.

In the present embodiment, by adjusting the above-described height d3, the microcavity effect can be obtained with respect to an arbitrary light-emission wavelength. If the height d3 is adjusted using the thickness of the organic layer 5, the ratio of occurrence between the microcavity effect and the light extraction effect can be changed by the position of the semi-transmissive/reflective film 13. That is, if the semi-transmissive/reflective film 13 is provided more on the base side of the recess 9 to make the height d3 larger, although the microcavity effect is reduced, the light extraction effect improves the luminance.

Figure 18:
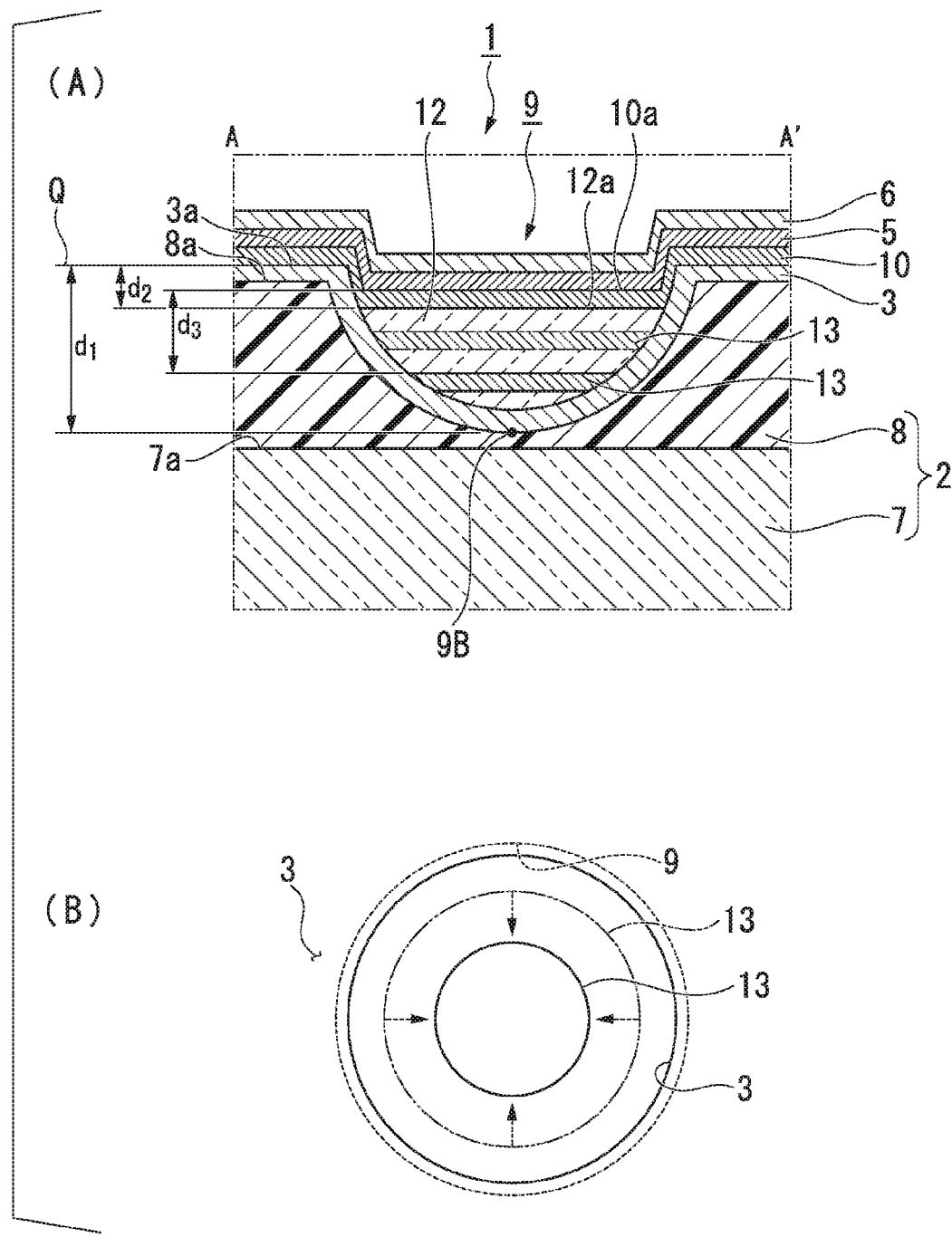

Referring to FIG. 18, the relationship between the position of the semi-transmissive/reflective film 13 inside the recess 9 and the occurrence ratio of the light extraction effect and the microcavity effect will be described.

FIG. 18(A) is a cross-sectional view showing the relationship between the height d3 and the position of the semi-transmissive/reflective film 13 inside the recess 9, and FIG. 18(B) is a plan view showing the relationship between the position of the semi-transmissive/reflective film 13 and the surface area.

As shown in the FIG. 18(A), the size of the height d3 is determined by the position of the semi-transmissive/reflective film 13 inside the recess 9, and the efficiency of occurrence between the microcavity effect and the light extraction effect is determined by the surface area of the semi-transmissive/reflective film 13.

As shown in the FIG. 18(A), because the cross-sectional shape of the recess 9 is an arc, if the semi-transmissive/reflective film 13 is provided on the base side of the recess 9 to increase the height d3, as shown in FIG. 18(B) the surface area of the semi-transmissive/reflective film 13 decreases. If the surface area of the semi-transmissive/reflective film 13 becomes small, the light reflected at the semi-transmissive/reflective film 13 is reduced.

The light striking the reflective layer 3 includes, in addition to light that has passed through the semi-transmissive/reflective film 13, light that strikes directly from the light-emitting layer. The smaller the surface area of the semi-transmissive/reflective film 13 becomes, the more the light directly striking the reflective layer 3 from the light emitting layer is increased. That is, the more the semi-transmissive/reflective film 13 is positioned toward the base side of the recess 9, the more the surface area of the semi-transmissive/reflective film 13 is reduced, the more the microcavity effect is reduced, and the more the light extraction effect is improved.

From the above, it is desirable that, from the tradeoff between color purity and contrast, the position of the semi-transmissive/reflective film 13 and the height d3 be determined to obtain an organic EL device 33 that exhibits the desired characteristics.

In this manner, by adjusting the ratio between the light extraction effect and the microcavity effect obtained in accordance with the position of the semi-transmissive/reflective film 13 (height d3), the light emission of the organic EL device 33 can be controlled.

The technical scope of the present invention is not restricted to the above-noted embodiments, and can be subjected to various modifications, within the scope of the spirit of the present invention.

In the above-noted embodiments, although the description has been for the example in which the cross-sectional shape of the recess 9 is an arc, the cross-sectional shape of the recess 9 need not be an arc, and may be elliptical or an arbitrary curve, and may include in part a straight line.

In addition, the specific constitution, such as the shapes, dimensions, numbers, disposition, constituent materials, and formation process of the various parts of the organic EL devices are not restricted to those noted above, and may be changed as appropriate.

An organic EL device of the present invention, in addition to a display device, can be applied to an illumination device or the like. For example, if the present invention is applied to an illumination device that generates white light, it is not necessary to have a plurality of unit light-emitting regions of different emitted colors that are mutually divided, as shown by example in the above embodiments. Specifically, for example, three types of dopant dyes of red, green, and blue may be doped into one light-emitting layer, the structure may be one of a laminate of a blue hole transport layer, a green electron transport light-emitting layer, and a red electron transport light-emitting layer, and the structure may be one of a laminate of a blue electron light-emitting transport layer, a green electron transport light-emitting layer, and a red electron transport light-emitting layer.

INDUSTRIAL APPLICABILITY

The present invention can be used in arbitrary electronic devices that have a light emitting part, such as a display device or an illumination device.

DESCRIPTION OF THE REFERENCE SYMBOLS

2 Substrate
3 Reflective layer
4, 10 First electrode
5 Organic layer
5b Lower surface
6 Second electrode
7a (Base material) upper surface
9 Recess
Q Plane
12 Filling layer
12A First filling layer
12B Section filling layer
13 Semi-transmissive/reflective film
16 Light-emitting layer
L1 Light
1, 32, 33 Organic EL device (illumination device, display device)

The invention claimed is:

1. An organic electroluminescence device comprising:
a base material in which a recess is provided at a first upper surface of the base material;
a reflective layer that is provided at least along a surface of the recess;
a filling layer that is filled into an inside of the recess via the reflective layer, the filling layer having light transmissivity;
a first electrode that is provided at least on a layer above the filling layer, the first electrode having light transmissivity;
an organic layer that is provided on a layer above the first electrode, the organic layer comprising at least a light-emitting layer; and
a second electrode that is provided on a layer above the organic layer, the second electrode having light transmissivity and light reflectivity, wherein
a portion of the reflective layer contacts a portion of the first electrode,
the first electrode includes a step that extends along an edge portion of the recess, and
the first electrode contacts the reflective layer at the edge portion.

2. The organic electroluminescence device according to claim 1, the organic electroluminescence device further comprising:
a semi-transmissive/reflective film that is provided between the first electrode and the reflective layer, the semi-transmissive/reflective film having light transmissivity and light reflectivity.

3. The organic electroluminescence device according to claim 2, wherein
the filling layer comprises a first filling layer and second filling layer, and
the semi-transmissive/reflective film is provided between the first filling layer and the second filling layer.

4. The organic electroluminescence device according to claim 1, wherein a lower surface of the first electrode at a position in the recess is positioned below a plane that includes the first upper surface.

5. The organic electroluminescence device according to claim 4, wherein the lower surface of the light-emitting layer at a position in the recess is positioned lower than a plane that includes the first upper surface.

6. The organic electroluminescence device according to claim 1, wherein the second electrode is constituted by a metal film.

7. The organic electroluminescence device according to claim 1, wherein a cross-section shape of the recess cut by an arbitrary plane that is perpendicular to the first upper surface is an arc.

8. An illumination device comprising:
the organic electroluminescence device according to claim 1.

9. An illumination device comprising:
the organic electroluminescence device according to claim 2.

10. A display device comprising:
the organic electroluminescence device according to claim 1.

11. A display device comprising:
the organic electroluminescence device according to claim 2.

12. The organic electroluminescence device according to claim 1, wherein the first electrode has light reflectivity in addition to the light transmissivity.

13. The illumination device according to claim 8, wherein the first electrode has light reflectivity in addition to the light transmissivity.

14. The display device according to claim 10, wherein the first electrode has light reflectivity in addition to the light transmissivity.

15. The organic electroluminescence device according to claim 1, wherein a second upper surface of the filling layer at a position in the recess is positioned below a plane that includes a third upper surface of the reflective layer.

16. The organic electroluminescence device according to claim 1, wherein a lower surface of the first electrode at a position in the recess is positioned below a plane that includes a second upper surface of the reflective layer.

* * * * *